(12) United States Patent  
Yamazaki et al.

(10) Patent No.: US 7,510,893 B2  
(45) Date of Patent: Mar. 31, 2009

(54) METHOD OF MANUFACTURING A DISPLAY DEVICE USING DROPLET EMITTING MEANS

(75) Inventors: Shunpei Yamazaki, Tokyo (JP); Kunio Hosoya, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 256 days.

(21) Appl. No.: 10/771,277

(22) Filed: Feb. 4, 2004

(65) Prior Publication Data

US 2005/0090029 A1    Apr. 28, 2005

(30) Foreign Application Priority Data

Feb. 5, 2003 (JP) .............................. 2003-028927  
Feb. 5, 2003 (JP) .............................. 2003-028931

(51) Int. Cl.  
H01L 21/00 (2006.01)

(52) U.S. Cl. .................. 438/30; 438/149; 438/584; 438/674

(58) Field of Classification Search .............. None  
See application file for complete search history.

(56) References Cited

U.S. PATENT DOCUMENTS

| | | | |
|---|---|---|---|
| 5,429,994 A | 7/1995 | Ishikawa | |
| 5,483,082 A | 1/1996 | Takizawa et al. | |
| 5,549,780 A | 8/1996 | Koinuma et al. | |
| 5,580,796 A | 12/1996 | Takizawa et al. | |
| 5,679,167 A | 10/1997 | Muehlberger | |
| 5,824,361 A | 10/1998 | Asanuma | |
| 6,051,150 A * | 4/2000 | Miyakawa | .................. 216/67 |
| 6,203,619 B1 | 3/2001 | McMillan | |
| 6,228,465 B1 * | 5/2001 | Takiguchi et al. | .......... 428/209 |

(Continued)

FOREIGN PATENT DOCUMENTS

EP          1340838          9/2003

(Continued)

OTHER PUBLICATIONS

International Search Report (Application No. PCT/JP2004/000895) and Written Opinion dated Apr. 27, 2004 with partial translation of Written Opinion.

(Continued)

*Primary Examiner*—Zandra Smith  
*Assistant Examiner*—Khanh B Duong  
(74) *Attorney, Agent, or Firm*—Nixon Peabody LLP; Jeffrey L. Costellia

(57) ABSTRACT

In a wiring manufacturing process which uses conventional photolithography, most of resist and wiring material, or process gas which is necessary at the time of plasma processing, etc. is wasted. Also, since air discharging means such as a vacuum equipment is necessary, an entire apparatus grows in size, and therefore, it has been a problem that production cost increases with growing in size of a processing substrate. In this invention, applied is such means that droplets are used for resist and wiring material, and they are emitted directly to a necessary place on the substrate in a line form or a dot form, to draw a pattern. Also, applied is means which carries out a gas reaction process such as ashing and etching, under atmospheric pressure or the vicinity of atmospheric pressure.

12 Claims, 27 Drawing Sheets

U.S. PATENT DOCUMENTS

| | | | |
|---|---|---|---|
| 6,231,917 B1 * | 5/2001 | Ito et al. | 427/9 |
| 6,429,400 B1 | 8/2002 | Sawada et al. | |
| 6,660,545 B2 | 12/2003 | Furusawa | |
| 6,782,928 B2 * | 8/2004 | Kweon et al. | 141/192 |
| 6,871,943 B2 * | 3/2005 | Ogawa | 347/84 |
| 6,909,477 B1 | 6/2005 | Yi et al. | |
| 7,176,069 B2 * | 2/2007 | Yamazaki et al. | 438/149 |
| 7,189,654 B2 * | 3/2007 | Yamazaki et al. | 438/706 |
| 2002/0022364 A1 * | 2/2002 | Hatta et al. | 438/673 |
| 2002/0109143 A1 | 8/2002 | Inoue | |
| 2002/0128515 A1 | 9/2002 | Ishida et al. | |
| 2002/0151171 A1 | 10/2002 | Furusawa | |
| 2003/0054653 A1 | 3/2003 | Yamazaki et al. | |
| 2003/0059975 A1 | 3/2003 | Sirringhaus et al. | |
| 2003/0059984 A1 | 3/2003 | Sirringhaus et al. | |
| 2003/0059987 A1 | 3/2003 | Sirringhaus et al. | |
| 2003/0060038 A1 | 3/2003 | Sirringhaus et al. | |
| 2003/0132987 A1 | 7/2003 | Ogawa | |
| 2004/0050685 A1 | 3/2004 | Yara et al. | |
| 2004/0075396 A1 | 4/2004 | Okumura et al. | |
| 2004/0224433 A1 | 11/2004 | Yamazaki et al. | |
| 2004/0253896 A1 | 12/2004 | Yamazaki | |
| 2004/0266073 A1 | 12/2004 | Yamazaki | |
| 2005/0011752 A1 | 1/2005 | Yamazaki et al. | |
| 2005/0013927 A1 | 1/2005 | Yamazaki | |
| 2005/0064091 A1 | 3/2005 | Yamazaki | |
| 2005/0167404 A1 | 8/2005 | Yamazaki | |

FOREIGN PATENT DOCUMENTS

| | | | |
|---|---|---|---|
| JP | 06-202153 | | 7/1994 |
| JP | 07-024579 | | 1/1995 |
| JP | 09-320363 | | 12/1997 |
| JP | 10-062814 | | 3/1998 |
| JP | 10062814 A | * | 3/1998 |
| JP | 411168042 A | * | 6/1999 |
| JP | 11-260597 | | 9/1999 |
| JP | 11-340129 | | 12/1999 |
| JP | 2000-169977 | | 6/2000 |
| JP | 2001-068827 | | 3/2001 |
| JP | 2001-093871 | | 4/2001 |
| JP | 2001-179167 | | 7/2001 |
| JP | 2002-066391 | | 3/2002 |
| JP | 2002-151478 | | 5/2002 |
| JP | 2002-215065 | | 7/2002 |
| JP | 2002-237463 | | 8/2002 |
| JP | 2002-237480 | | 8/2002 |
| JP | 2002-289864 | | 10/2002 |
| JP | 2002-324966 | | 11/2002 |
| JP | 2002-359246 | | 12/2002 |
| JP | 2002-359347 | | 12/2002 |
| JP | 2003-017413 | | 1/2003 |
| JP | 2003-311197 | | 11/2003 |
| JP | 2003-347284 | | 12/2003 |
| WO | WO-01-47044 | | 6/2001 |
| WO | WO-02-40742 | | 5/2002 |
| WO | WO-2004/070809 | | 8/2004 |
| WO | WO-2004/070810 | | 8/2004 |
| WO | WO-2004/070811 | | 8/2004 |
| WO | WO-2004/070819 | | 8/2004 |
| WO | WO-2004/070820 | | 8/2004 |
| WO | WO-2004-070821 | | 8/2004 |
| WO | WO-2004-070822 | | 8/2004 |

OTHER PUBLICATIONS

International Search Report (Application No. PCT/JP2004/000897) and Written Opinion dated Apr. 27, 2004 with partial translation of Written Opinion.
International Search Report (Application No. PCT/JP2004/000899) and Written Opinion dated Apr. 27, 2004 with partial translation of Written Opinion.
International Search Report (Application No. PCT/JP2004/000900) and Written Opinion dated Jun. 1, 2004 with partial translation of Written Opinion.
International Search Report (Application No. PCT/JP2004/000915) and Written Opinion dated Apr. 27, 2004 with partial translation of Written Opinion.
International Search Report (Application No. PCT/JP2004/000918) and Written Opinion dated Apr. 27, 2004 with partial translation of Written Opinion.
International Search Report (Application No. PCT/JP2004/000930) and Written Opinion dated Apr. 13, 2004 with partial translation of Written Opinion.
International Search Report (Application No. PCT/JP2004/000932) and Written Opinion dated Apr. 6, 2004 with partial translation of Written Opinion.
S. Wolf et al. "*Silicon Processing for the VLSI ERA*" vol. 1 (Process Technology), pp. 198, 408, 427, 539, 542, 535; Jan. 1, 1986.

* cited by examiner (A)

(B)

(C)

(A)

(B)

(A)

(B)

(C)

METHOD OF MANUFACTURING A DISPLAY DEVICE USING DROPLET EMITTING MEANS

TECHNICAL FIELD

This invention relates to a manufacturing method of a display device which uses droplet emitting means and an atmospheric pressure plasma processing method.

BACKGROUND ART

Manufacture of circuit patterns of thin film transistors (TFT) etc. which are included in a display device typified by a liquid crystal display device (LCD) and a light-emitting display device (EL(Electro-Luminescence)) display device) has used a vacuum process which is carried out in such a status that an inside of a processing apparatus is in reduced pressure or vacuum, and a photolithography process in which a mask, which comprises a (photo) resist, is manufactured by a light exposure apparatus and an unnecessary portion is removed by etching. (See, Patent Document 1)

(Patent Document 1) JP-A-2002-359246 publication

The vacuum process requires air discharging means for forming a vacuum or reducing a pressure of a process chamber for carrying out film-formation, etching etc. for a substrate to be processed. The air discharging means is composed of a pump typified by a mechanical booster pump and a turbo molecular pump, an oil rotation pump etc., which are disposed outside a processing apparatus, means which manages, controls them, and also, piping and valves etc. which couples the pump and a processing chamber to configure an air discharging system. In order to lay out the equipment, a space for the air discharging system becomes necessary outside the processing apparatus, and costs for the same become also necessary. Further, since it is also necessary to mount equipment of the air discharging system to the processing apparatus itself, a size of the processing device becomes larger as compared to a thing on which the air discharging system is not mounted.

A photolithography process which has been used since a long time ago, for circuit pattern formation of thin film transistors etc., e.g., a photolithography process for wiring formation is carried out as follows. Firstly, a photosensitive resist (photo resist) is spin-coated on an electric conductive film which is film-formed on a substrate, and thereby, the resist is spread out on an whole surface of the electric conductive film. Next, light irradiation is carried out through a photo mask on which a pattern is formed by metal, to expose the resist to light. Subsequently, development and post bake are carried out, to form a resist pattern with a pattern shape of the photo mask. Further, by use of the resist which is formed in a pattern shape as a mask, etching processing is applied to the electric conductive film under the resist. Finally, the resist pattern, which is used as the mask, is peeled off, and thereby, it is possible to carry out etching of the electric conductive film, in a pattern shape formed on the photo mask, and a remaining electric conductive film is used as wiring.

However, in the vacuum process in the prior art, in connection with size growing of a meter square size of fifth, sixth generations or later, a volumetric of a process chamber also expands. Here, the fifth generation means a mother glass substrate size of 1000×1200 mm$^2$, and the sixth generation means a mother glass substrate size of 1400×1600 mm$^2$. On this account, in order to run the process chamber into a vacuum or reduced pressure status, larger-sized air discharging system becomes necessary, and also, time necessary for air discharge also increases. Further, also in a cost phase, equipment cost and maintenance cost etc. of the air discharging system mount up. In addition, also in a case of replacing the chamber with gas such as nitrogen, a much more amount of gas becomes necessary because of volume increase of the chamber, which has an influence on production cost. Further, in connection with size growing of the substrate, huge running costs are required for power supply etc., and therefore, it results in increase of environment burdens.

Also, in a process which uses a photolithography process in the prior art, e.g., a wiring manufacturing process, a large portion of a coated film (resist, metal, semiconductor etc.) which is film-formed on a whole surface of the substrate is removed by etching, and a proportion that wiring etc. remain on the substrate, has been a range of several to several dozen %. On the occasion of forming a resist film by spin coating, approximately 95% has been wasted. In short, a most part of a material is to be thrown away, which not only has an influence on production cost, but also invites increase of environmental burdens. Such trend becomes obvious as a substrate, which flows on a production line, grows in size.

DISCLOSURE OF THE INVENTION

In order to solve the above-described problems of the prior art, the invention applies means which emits a resist and a wiring material directly to a necessary place on a substrate as droplets, to draw a pattern. Also, it applies means which carries out a gas phase reaction process such as ashing and etching under atmospheric pressure or in the vicinity of atmospheric pressure. By applying these means, it is possible to significantly reduce quantity of gas consumed which is used for a coated film material (resist, metal, semiconductor, etc.) and the gas phase reaction process, which have been the conventional object.

In the invention, as the above-described droplet emitting means, used is a droplet emitting apparatus which is equipped with a droplet emitting head in which a plurality of droplet emitting holes are disposed in a line form. Also, as a plasma processing method for carrying out the above-described gas phase reaction process, used is a plasma processing apparatus which is equipped with plasma generating means under atmospheric pressure or in the vicinity of atmospheric pressure.

Also, another configuration of the invention uses a droplet emitting apparatus which is equipped with a droplet emitting head in which one or a plurality of droplet emitting holes are disposed in a dot form, as the above-described droplet means. Also, as the plasma processing method for carrying out the above-described gas phase reaction process, used is a plasma processing apparatus which has plasma generating means under atmospheric pressure or in the vicinity of atmospheric pressure, to carry out local plasma processing.

The above-descried means which emits droplets, or the above-described gas phase reaction process is designed to be carried out under atmospheric pressure or in the vicinity of atmospheric pressure. On that account, it becomes possible to omit an air discharging system for realizing a vacuum or reduced pressure status in a process chamber, which is required in a conventional vacuum process. Therefore, it is possible to simplify the air discharging system which grows in size based on size growing of a substrate, and it is possible to reduce equipment cost. Also, in compliance with this, it becomes possible to suppress energy etc. for discharging air, which results in reduction of environmental burdens. Further, since it is possible to omit time for air discharge, tact time is improved, so that it becomes possible to carry out production of a substrate more effectively.

BEST MODE FOR CARRYING OUT THE INVENTION

Implementation modes of the invention will be hereinafter explained by showing the drawings. In this regard, however, it is possible to carry out the invention in many different modes, and it is easily understood by a person with an ordinary skill in the art that it is possible to, without going beyond purport of the invention and its scope, modify its form and detail. Therefore, it is not interpreted so as to be limited to a description content of the present implementation modes.

Meanwhile, in all figures for explaining the implementation modes, an identical number is given to an identical portion or a portion which has a similar function, and its repeating explanation will be omitted.

(Implementation Mode 1)

Figure 6:
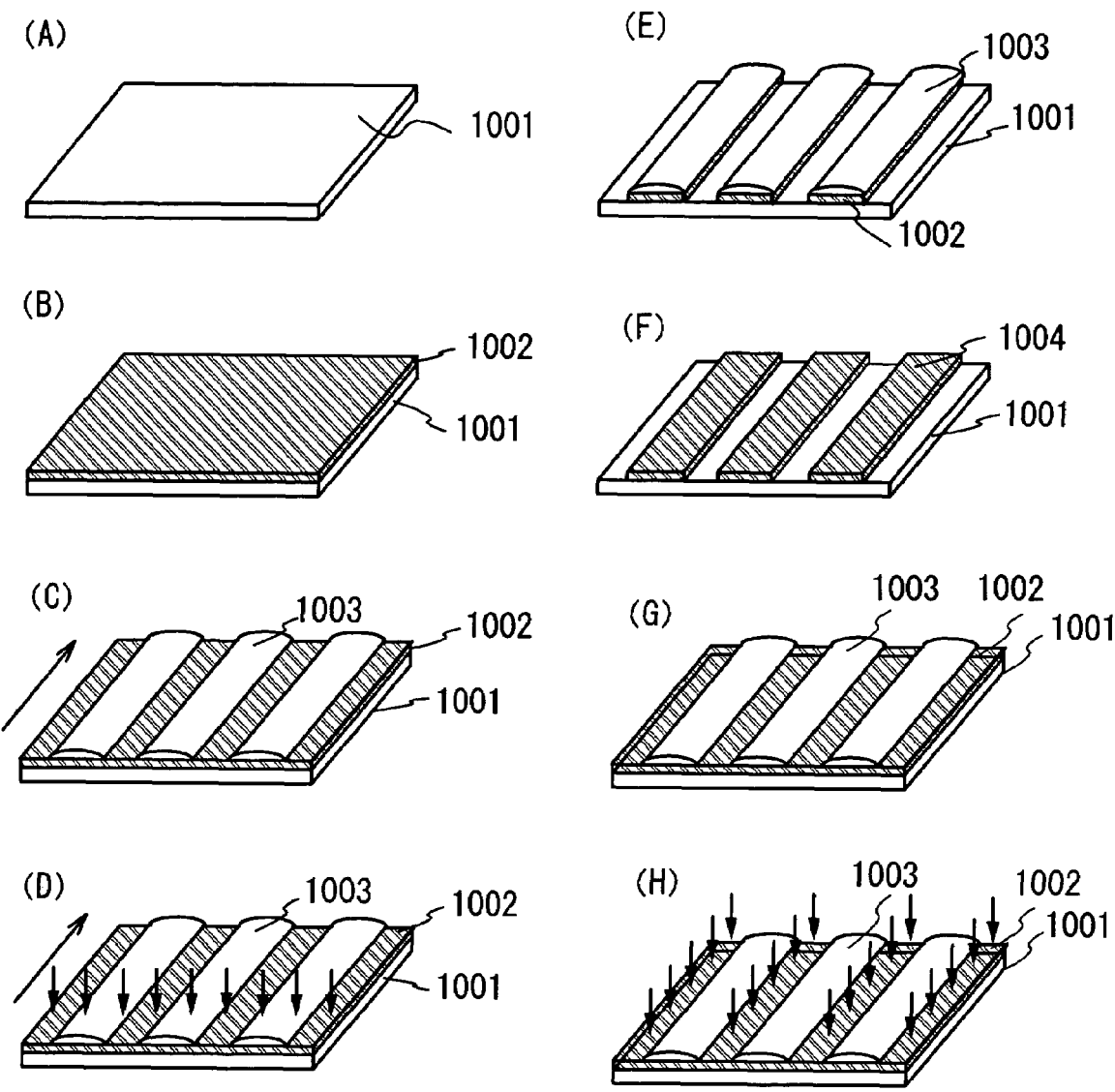
FIG. 6 is a typical perspective view of a processing process which uses the invention.

An implementation mode 1 of the invention uses a droplet emitting apparatus which has a droplet emitting head in which a plurality of droplet emitting holes are disposed in a line form, and a plasma processing apparatus which has plasma generating means under atmospheric pressure or the vicinity of atmospheric pressure, and thereby, manufactures a wiring pattern which is indispensable as a display device, on a glass substrate with a desired size. In particular, the invention intends to be applied to a meter square substrate of fifth, sixth generations or later, which grows in size. Hereinafter, the implementation mode 1 of the invention will be explained with reference to FIG. 6.

Firstly, by use of a publicly known method, for example, a sputter or CVD method (Chemical Vapor Deposition method), an electric conductive film, which becomes wiring, is film-formed on a substrate 1001 to be processed (FIGS. 6(A), (B)). Next, by use of a droplet emitting apparatus which has a droplet emitting head in which a plurality of droplet emitting holes are disposed in a line form, which will be described later, a resist pattern 1003 is formed on a part where a wiring pattern is formed (FIG. 6(C)). The resist pattern 1003 is formed in a line form pattern, by overlapping droplets which are emitted from circular droplet emitting holes, and then, emitting them. In short, the droplet emitting head is scanned in a direction of an arrow shown in FIG. 6(C), over emitting droplets in such a manner that they are overlapped, and thereby, a shape of the resist pattern 1003 is formed. However, it is possible to form an arbitrary pattern, but not limited to the line form.

Next, by use of the baked resist pattern as a mask, and by use of a plasma processing apparatus which has plasma generating means under atmospheric pressure or the vicinity of atmospheric pressure, a surface 1002 to be processed, on which the resist pattern 1003 has been formed, is etched (FIG. 6(D)). The etching, which is carried out here, is carried out by scanning the plasma generating means, in such a manner that the line form plasma generating means advances in a direction of an arrow in FIG. 6(D) (upper right direction in the drawing). As etching gas at this time, used is gas which reacts with an electric conductive film. By carrying out the above-described etching processing, only an exposed electric conductive film 1002, on which the resist pattern 1003 is not formed, is etched (FIG. 6(E)).

After the etching processing, ashing is applied to the remaining resist pattern 1003 by use of the similar above-described plasma processing apparatus, to remove it. Scanning of the plasma generating means at the time of the ashing is carried out in the same manner as at the time of the etching. As a result of that, only an electric conductive film remains at a resist pattern forming place, and a wiring pattern 1004 is formed (FIG. 6(F)). Meanwhile, as gas at the time of ashing, used is oxygen with high reactivity.

Figure 1:
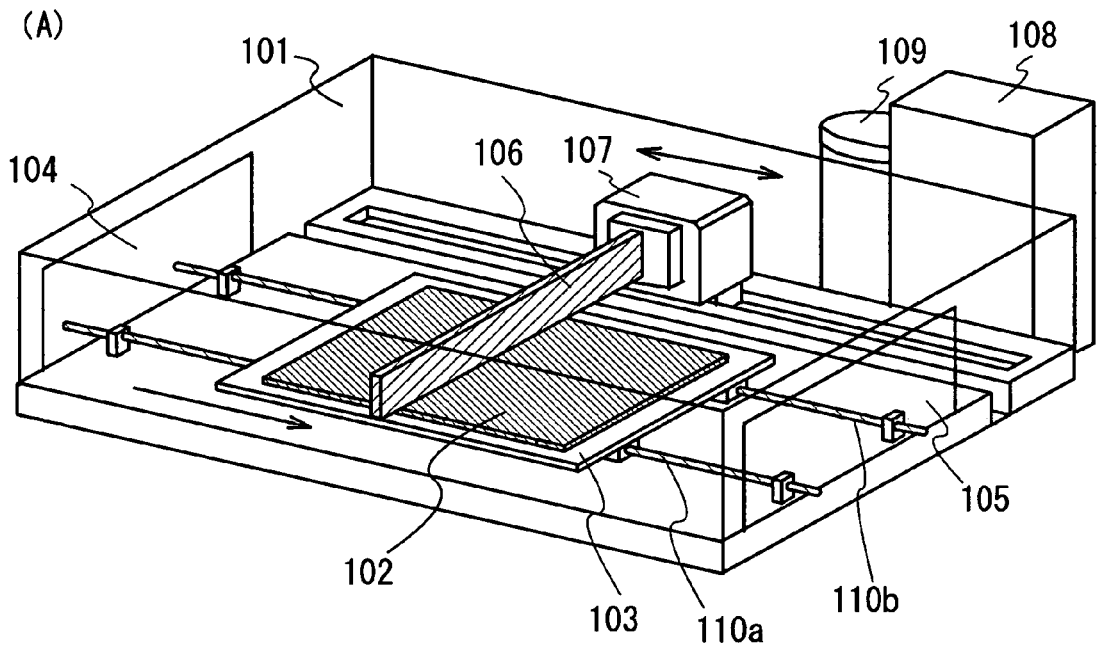
FIGS. 1(A) to (B) are perspective views which show a configuration of a line form droplet emitting apparatus of the invention.
Figure 1:
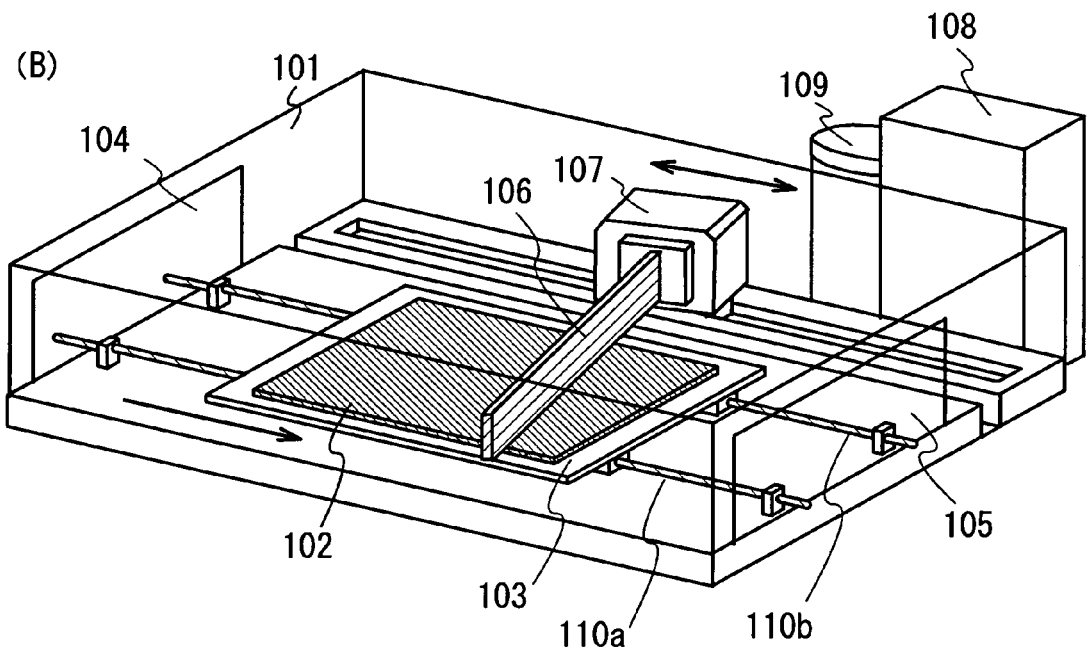
Figure 2:
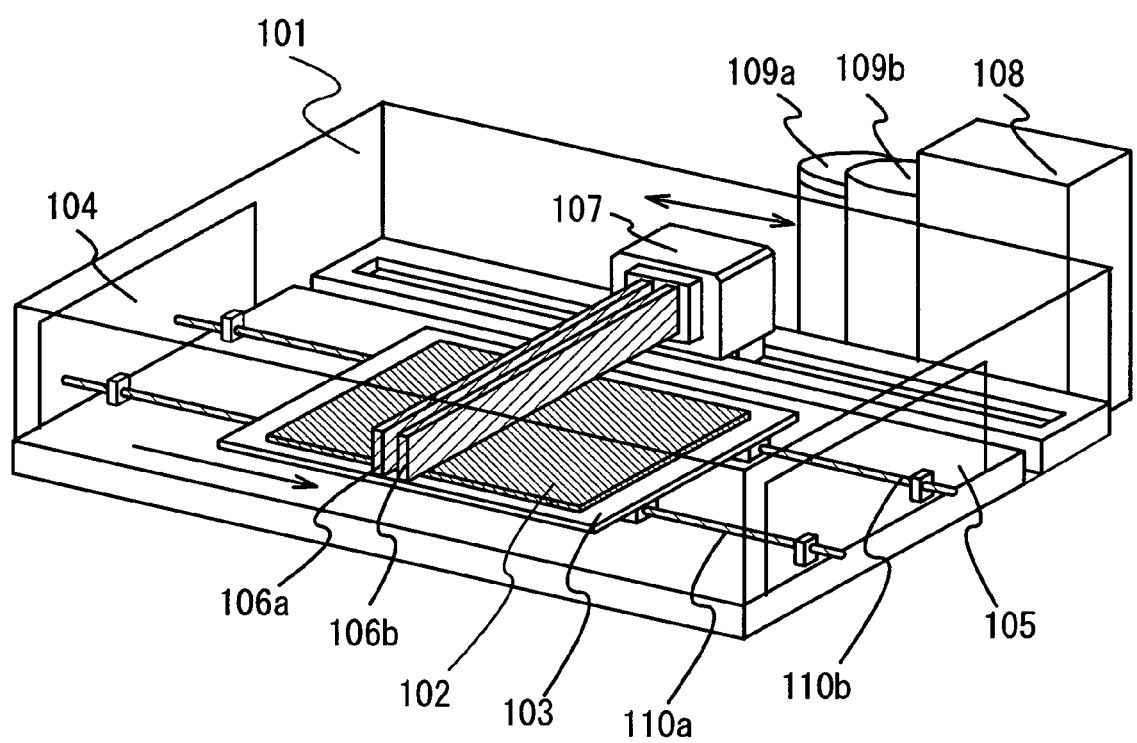
FIG. 2 is a perspective view which shows the configuration of the line form droplet emitting apparatus of the invention.
Figure 3:
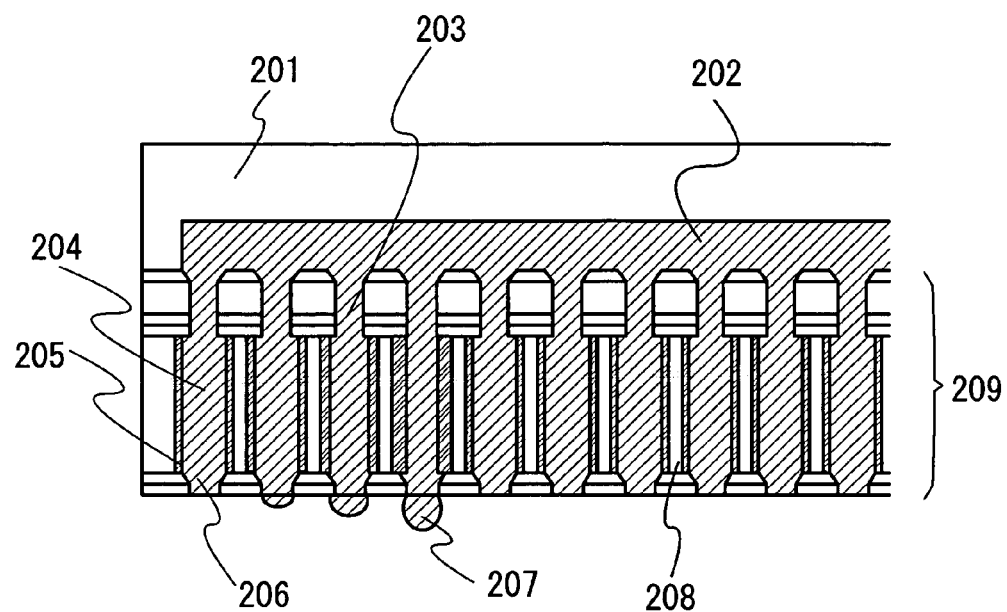
FIGS. 3(A) to (B) are views which show the configuration of the line form droplet emitting apparatus of the invention.
Figure 3:
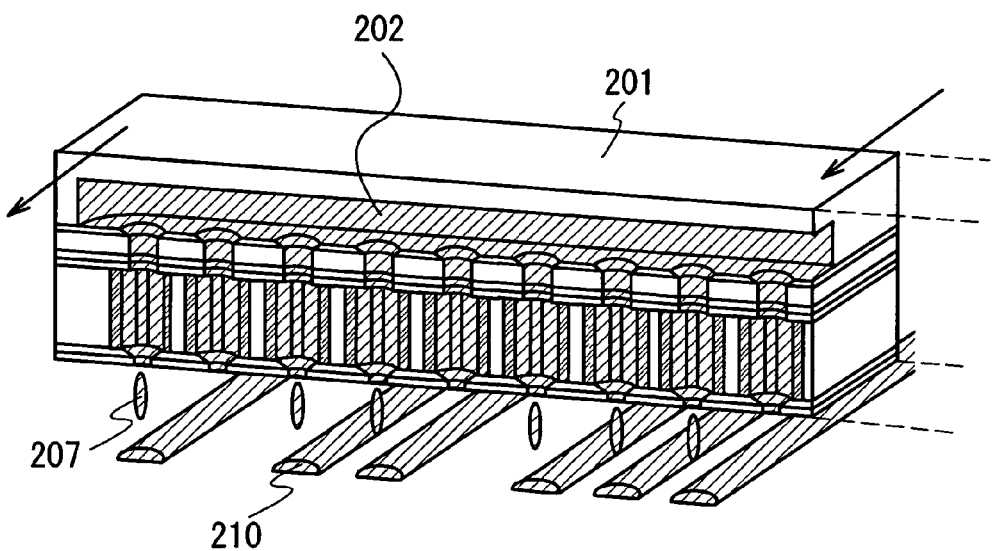
Figure 4:
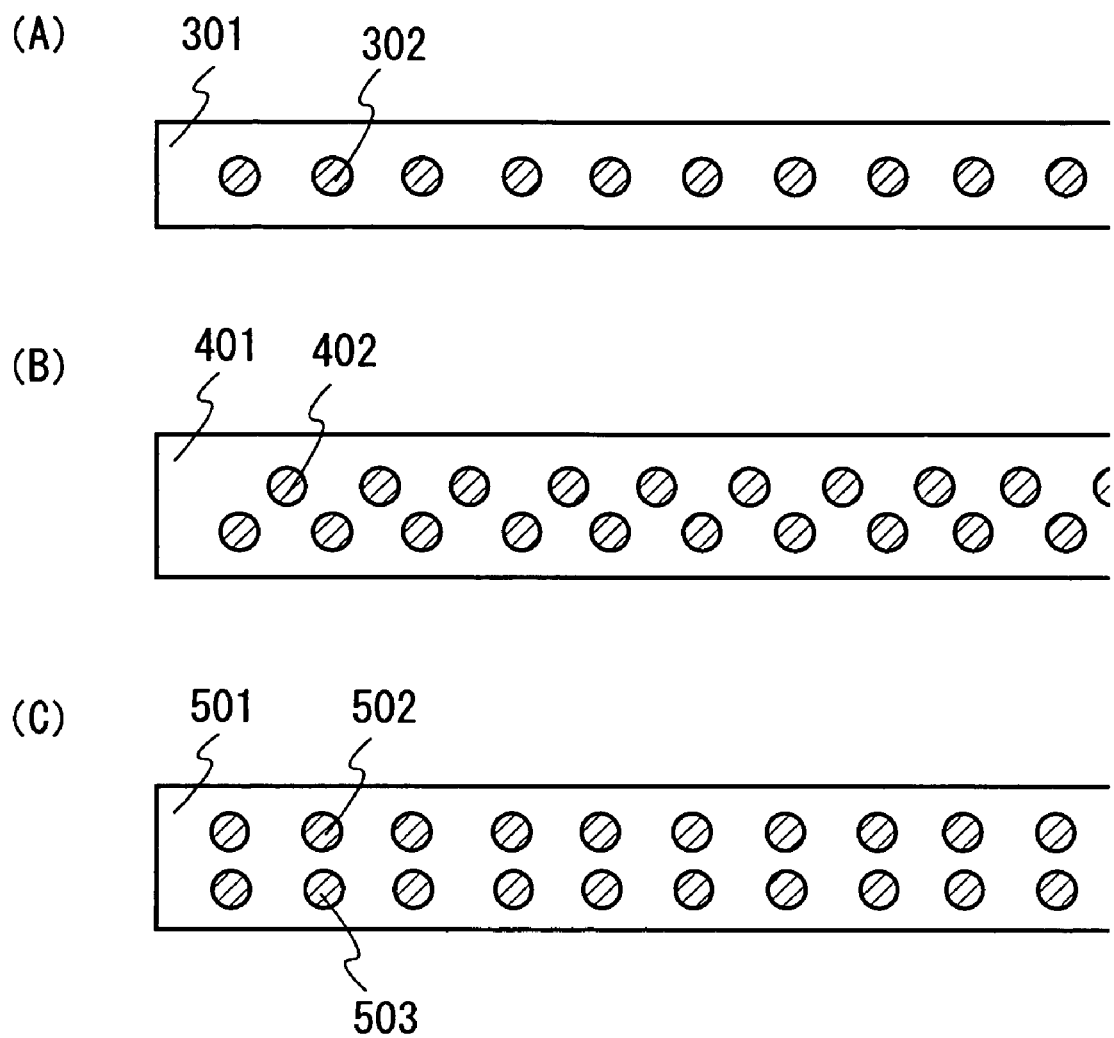
FIGS. 4(A) to (C) are views which show a bottom surface of a droplet emitting part of the line form droplet emitting apparatus of the invention.

Hereinafter, a line form droplet emitting apparatus used in the implementation mode 1, which has a droplet emitting head in which a plurality of droplet emitting holes are disposed in a line form, will be described with reference to FIGS. 1 to 4. FIG. 1 and FIG. 2 are schematic perspective views which showed one configuration example of the line form droplet emitting apparatus, and also, FIG. 3, FIG. 4 are views which showed a head part used for this line form droplet emitting apparatus, in which nozzles are disposed.

The line form droplet emitting apparatus shown in FIG. 1(A) has a head 106 in the apparatus, and droplets are emitted by this, and thereby, a desired droplet pattern is obtained on a substrate 102. In the line form droplet emitting apparatus, as the substrate 102, it is possible to apply to an object to be processed such as a resin substrate typified by a plastic substrate, or a semiconductor wafer typified by silicon, in addition to the glass substrate with a desired size.

In FIG. 1(A), the substrate 102 is carried from a carry-in entrance 104 in to an inside of a housing 101, and the substrate, for which droplet emission processing is finished, is carried out from a carry-out outlet 105. In the inside of the housing 101, the substrate 102 is mounted on a carrier table 103, and the carrier table 103 moves on rails 110a, 110b which connect the carry-in entrance and the carry-out outlet.

A head support part 107 supports a head 106 which emits droplets, and moves in parallel with the carrier table 103. When the substrate 102 is carried in to the inside of the housing 101, at the same time as this, the head support part 107 moves in tune with a predetermined position where first droplet emission processing is carried out. The movement of the head 106 to an initial position is carried out at the time of substrate carry-in, or at the time of substrate carry-out, and thereby, it is possible to carry out emission processing effectively.

The droplet emission processing is started when the substrate 102 reaches to a predetermined position, by the movement of the carrier table 103. The droplet emission processing is accomplished by a combination of relative movement of the head support part 107 and the substrate 102, and droplet emission from the head 106 which is supported by the head support part. By adjusting moving speed of the substrate and the head support part, and a cycle for emitting droplets from the head 106, it is possible to draw a desired droplet pattern on the substrate 102. In particular, the droplet emission processing requires high accuracy, and therefore, it is desirable that movement of the carrier table is stopped at the time of droplet emission, and only the head support part 107 with high controllability is scanned sequentially. It is desirable to select a drive system with high controllability, such as a servo motor and a pulse motor, for drive of the head 106. Also, scanning of the head 106 through the use of the head support part 107 is not limited to only one direction, but it would be fine if the droplet emission processing is carried out, by carrying out reciprocation or repetition of reciprocation. By the above-described movement of the substrate and the head support part, it is possible to emit droplets to a whole area of the substrate.

The droplets are supplied from a droplet supply part 109 which is disposed outside the housing 101, to an inside of the housing, and further, supplied through the head support part 107 to a liquid chamber in an inside of the head 106. This droplet supply is controlled by control means 108 which is disposed outside the housing 101, but may be controlled by control means which are built in the head support part 107 in the inside of the housing 101.

The control means 108 has major functions such as movement of the carrier table and the head support part, and control of droplet emission which responds to this movement, in addition to the above-described control of droplet supply. Also, it is possible to download data of pattern drawing by droplet emission, from an outside of the apparatus through software such as CAD, and these data are inputted by methods of a graphic input and a coordinate input, etc. Also, a mechanism for detecting a remaining amount of a composition which is used as droplets is disposed in the inside of the head 106, to transfer information which shows the remaining amount to the control means 108, and thereby, an automatic remaining amount warning function may be added.

Although it is not described in FIG. 1(A), further, a sensor for alignment of the substrate and the pattern on the substrate, gas introducing means to the housing, air discharging means for the inside of the housing, means for carrying out heat treatment for the substrate, means for irradiating light to the substrate, and in addition, means for measuring various values of physicality such as temperature and pressure may be disposed according to need. Also, it is also possible to control these means collectively by the control means 108 which is disposed outside the housing 101. Further, if the control means 108 is connected to a production management system etc. by a LAN cable, wireless LAN, an optical fiber, etc., it becomes possible to uniformly manage processes from an outside, which results in improving productivity.

Next, a configuration of the inside of the head 106 will be explained. FIG. 3(A) is such a thing that a cross section of the head 106 of FIG. 1(A) is viewed in a longitudinal direction, and a right side of FIG. 3(A) is communicated with the head support part. Also, FIG. 3(B) is a perspective view which shows a scanning direction of the head 106, together with an example of wiring formation by droplet emission.

In FIG. 3(A), droplets which are supplied from an outside to an inside of a head 201, after they passed through a common liquid chamber flow path 202, are distributed to each nozzle 209 for emitting droplets. Each nozzle part is composed of a fluid resistance part 203 which is disposed so as for moderate droplets to be loaded in the nozzle, a compressing chamber 204 for compressing droplets and emitting them to an outside of the nozzle, and a droplet emitting hole 206.

Here, it is desirable that a diameter of the droplet emitting hole 206 is as small as possible, for preventing clogging of the nozzle and forming a pattern with high-resolution. On that account, a diameter of the emitting hole is set to 0.1 to 50 μm (preferably 0.6 to 26 μm), and emission quantity of a composition which is emitted from the nozzle is set to 0.00001 pl to 50 pl (preferably 0.0001 to 40 pl). This emission quantity increases in proportion to a size of the diameter of the nozzle. Also, it is desirable that a distance between an object to be processed and the droplet emitting hole 206 is approximated, to the greatest extent possible, and preferably, it is set to a range of 0.1 to 2 mm. Meanwhile, even if the diameter of the droplet emitting hole 206 is not changed, it is possible to control emission quantity by changing a pulse voltage which is applied to a piezoelectric element. It is desirable that these emission conditions are set up in such a manner that a line width becomes 10 μm or less.

Also, 300 Pa·s or less is suitable for viscosity of the composition which is used for emission of droplets. This is because dryness is prevented, and a composition is enabled to be poured out smoothly from the emission hole. Further, it would be fine if viscosity of the composition, surface tension, etc. are adjusted on a timely basis, in tune with a solvent which is used, and a use application.

On a side wall of the compressing chamber 204, disposed are piezoelectric elements 205 which have PIEZO electric effect, such as titanic acid.zirconium acid.lead($Pb(Zr,Ti)O_3$). On this account, by applying a voltage to the piezoelectric element 205 which is disposed on a target nozzle, it is possible to push out droplets in the compressing chamber 204, and emit the droplets 207 to an outside. Also, each piezoelectric elements is isolated by an insulator 208 which contacts with this, and therefore, there occurs no such a case that they contact with each other electrically, and it is possible to control emission of individual nozzles.

In the invention, the droplet emission is carried out by a so-called PIEZO system which uses a piezoelectric element, but depending on a material of droplets, a so-called thermal system (thermal ink-jet system), in which a heating element is heated to generate air bubbles and to push out droplets, may be used. In this case, it becomes such a configuration that the piezoelectric element 205 is replaced with the heating element.

Also, in a nozzle part 209 for droplet emission, a wet property between droplets and the common liquid chamber flow path 202, the fluid resistance part 203, the compressing chamber 204, and further, the droplet emitting holes 206 becomes important. On that account, it would be fine if a carbon film, a resin film, etc. (not shown in the figure) for adjusting the wet property with a material are also formed in respective flow paths.

By the above-described means, it is possible to emit droplets on a processed substrate. In the droplet emitting system, there are a so-called sequential system (dispenser system) in which droplets are emitted continuously to form a continuous line form pattern, and a so-called on-demand system in which droplets are emitted in a dot form manner, and in an apparatus configuration in the invention, the on-demand system was shown, but it is also possible to use a head by use of the sequential system.

FIG. 3(B) is a perspective view which shows a scanning example at the time of droplet emission of the head 201. Since the head 201 can move in a direction of an arrow (an object to be processed may be moved in a reverse direction), it is possible to form a straight line form wiring pattern 210 as shown in FIG. 3(B), by emitting droplets in such a manner that droplets, which are landed in the object to be processed, are overlapped. In particular, as shown in FIG. 3(B), it is possible to control the droplet emitting holes which emit the droplets 207, and the droplet emitting holes which do not emit droplets, with respect to each droplet emitting hole. Further, if a mechanism, which scans the head 201 in a direction perpendicular to the above-described scanning, it becomes possible to draw a wiring pattern in a lateral direction, which is perpendicular to the wiring pattern 210, and by extension, drawing of an arbitrary pattern becomes possible. In this case, it would be fine if the scanning of the head 201 in a direction which is perpendicular to the above-described scanning can move by an extent of a distance between adjacent droplet emitting holes.

FIGS. 4(A) to (C) are things which typically represent a bottom part of the head in FIG. 3. FIG. 4(A) is of such a basic arrangement that a plurality of droplet emitting holes 302 are aligned in a line form on a bottom surface of the head 301. In contrast to this, in FIG. 4(B), droplet emitting holes 402 of a head bottom surface 401 are aligned in two lines, and respective lines are disposed with shifting a half pitch. If the head with arrangement of FIG. 4(B) is used, without disposing the above-described mechanism for scanning of the head in a direction which is perpendicular to the object to be processed, it is possible to draw a continuous wiring pattern in the above-described direction, and by extension, it is possible to draw an arbitrary pattern. Also, FIG. 4(C) shows such an arrangement that a line is increased to 2 lines without shifting a pitch. In the arrangement of FIG. 4(C), after droplet emission from first stage droplet emitting holes 502, similar droplets are emitted to the similar place with time difference, and thereby, before droplets on the substrate, which has been already emitted, are dried and solidified, it is possible to further accumulate identical droplets thickly. Also, in a case that clogging occurred in first stage nozzle parts due to droplets etc., it is also possible to have second stage droplet emitting holes functioned as backup.

Further, by disposing emitting holes 302 at a slant to the object 102 to be processed, it would be also fine if droplets are emitted at the slant to the object to be processed. It would be also fine if the slant is slanted by a slanting mechanism with which the head 106 or the head support part 107 is equipped, and it would be also fine if shapes of the droplet emitting holes 302 in the head 106 are tapered, and droplets are emitted in a slanted manner. By the above-described slanted emission of droplets, a wet property with droplets which are emitted to a surface of the object 102 to be processed is controlled, and thereby, it becomes possible to control shapes of droplets at the time when they land in the object to be processed.

As a composition which is used as droplets of the above-described dot form droplet emitting apparatus, it is possible to use a photosensitive resist, a paste form metal material or an organic liquid solution such as electric conductive polymer, in which the paste form metal is dispersed, an organic liquid solution such as electric conductive polymer, in which a ultra-fine particle form metal material and the above-described material are further dispersed, and so on. The ultra-fine particle form metal material is a metal material which is processed to fine particles of several μm to sub μm, or fine particles of nm level, and any one of, or both of the particles are dispersed in an organic liquid solution, to be used.

In a case that the ultra-fine particle form metal material was used as the composition, there is a necessity to select the ultra-file particle form metal material with a enough size to come around into a contact hole and a narrow groove part, etc.

It would be fine if these droplets are heated and dried at the time of droplet land-in, by use of a heating mechanism (not shown in the figure) which is attached to the carrier table 103 of the substrate, and it would be also fine if, after land-in of droplets in a necessary area is completed, or after all droplet emission processing is completed, they are heated and dried. The above-described resist is baked by heat treatment, and can be used as a mask at the time of etching. Also, the above-described organic liquid solution which include the ultra-fine particle form metal material can be used as metal wiring, on the assumption that the organic liquid solution is evaporated by the heat treatment, and ultra-fine particle form metals are coupled.

Further, a line form droplet emitting apparatus shown in FIG. 1(B), in which improvement was further applied to the line form droplet emitting apparatus shown in FIG. 1(A), will be explained. In this apparatus, it is designed in such a manner that a rotating mechanism is disposed on the head support part 107, to rotate it with an arbitrary angle θ, and thereby, the head 106 has an angle to the substrate 102. The angle θ permits an arbitrary angle, but having regard to a size of an entire apparatus, it is desirable to be within 0° through 45°, to such a direction that the substrate 102 moves. By this rotating mechanism which is provided to the head support part 107, it is possible to draw a droplet pattern, with a narrower pitch than a pitch of droplet emitting holes which are disposed in the head.

Also, FIG. 2 is of a line form droplet emitting apparatus with a so-called twin head configuration, in which two pieces of the heads 106 of the line form droplet emitting apparatus shown in FIG. 1(A) are disposed. In this apparatus, unlike the arrangement shown in FIG. 4(C) in which two lines of droplet emitting holes are disposed in an inside of the head, it is possible to carry out droplets which have different materials, collectively by identical scanning. In short, it enables such continuous pattern formation that, over carrying out pattern formation due to emission of droplets A by a head 106a, pattern formation due to emission of droplets B by a head 106b is carried out with an interval of a slight time difference. 109a and 109b designate droplet supply parts, and store and supply the droplets A and the droplets B which are used in respective heads. By use of this twin head configuration, it is possible to simplify processes, and it becomes possible to increase efficiency significantly.

The above-described line form droplet emitting apparatus can carry out under atmospheric pressure or in the vicinity of atmospheric pressure, unlike a resist coating process, a film-formation and etching process in a conventional photolithography process. The vicinity of atmospheric pressure shows a pressure range of 5 Torr to 800 Torr. In particular, it is also possible for the above-described droplet emitting apparatus to carry out emission of droplets under positive pressure of an extent of 800 Torr.

By use of the above-described line form droplet emitting apparatus, the resist pattern 1003 is formed in the implementation mode 1 of the invention, and thereby, a resist is used only for a necessary place for forming a wiring pattern, and therefore, as compared to a spin coating method which is used in the prior art, it becomes possible to dramatically reduce quantity of the resist consumed.

Figure 5:
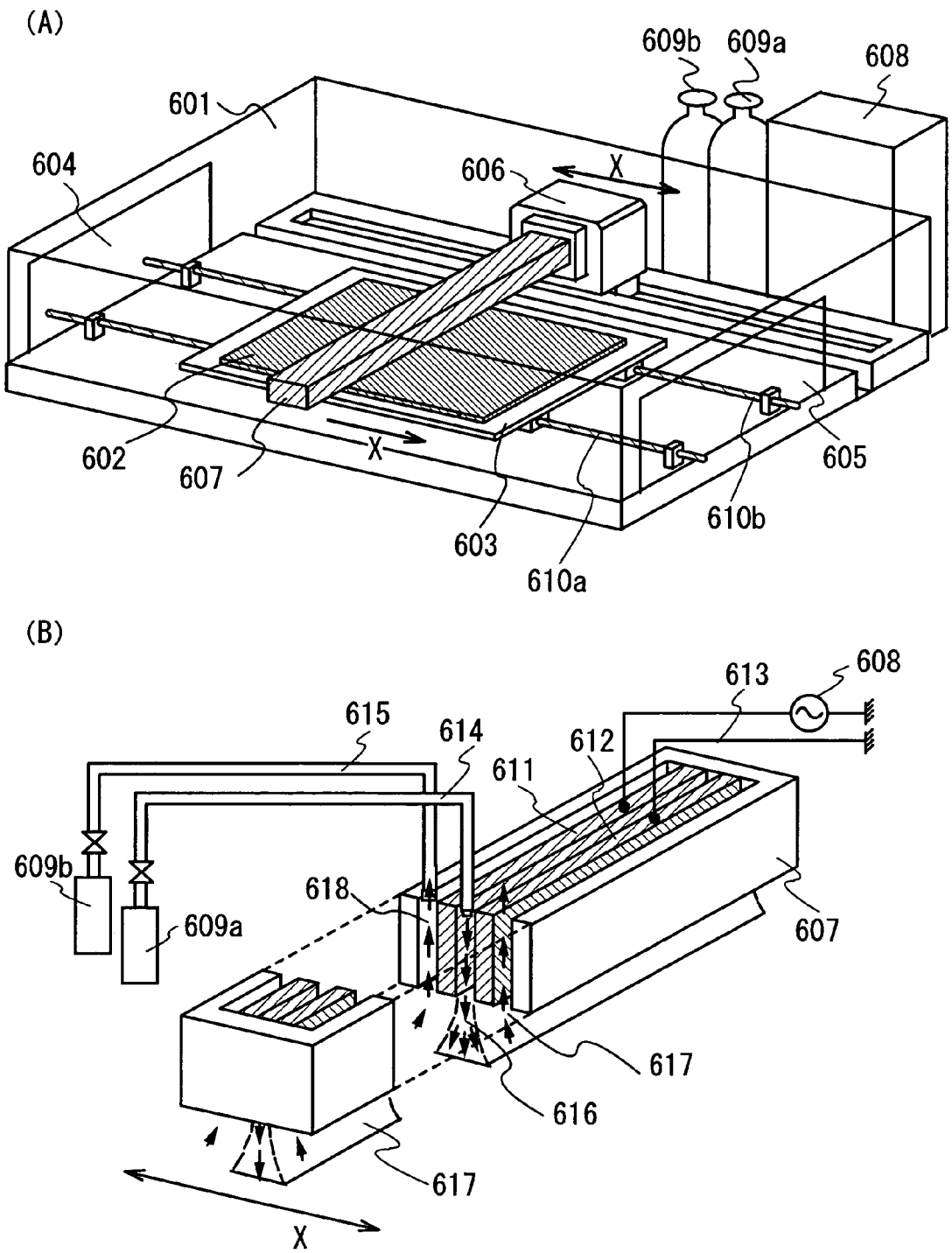
FIG. 5(A) is a perspective view which shows a configuration of an atmospheric pressure plasma processing apparatus of the invention, (B) is a view which shows a configuration of a plasma generating part of the atmospheric pressure plasma processing apparatus of the invention.

Next, a plasma processing apparatus which has plasma generating means under atmospheric pressure or the vicinity of atmospheric pressure, which is used in the implementation mode 1, will be explained with reference to FIG. 5. FIG. 5(A) is a perspective view of the plasma processing apparatus which is used in the invention. In the plasma processing apparatus, handled is an object 602 to be processed such as a glass substrate with a desired size and a resin substrate typified by a plastic substrate, which configures a display device. As a carrying system of the object 602 to be processed, horizontal carrying is cited, but in a case of using a meter square substrate of a fifth generation or later, with the aim of reduction of an occupied area of a carrying machine, vertical carrying with a substrate being placed vertically may be carried out.

In FIG. 5(A), the object 602 to be processed is carried from a carry-in entrance 604 into an inside of a housing 601 of the plasma processing apparatus, and a processed object, for which plasma surface processing is finished, is carried out from a carry-out outlet 605. In the inside of the housing 601, the processed object 602 is mounted on a carrier table 603, and the carrier table 603 moves on rails 610a, 610b which connect the carry-in entrance 604 and the carry-out outlet 605.

In an inside of the housing 601 of the plasma processing apparatus, disposed are plasma generating means 607 which has parallel flat plate electrodes, a movable support mechanism 606 which moves the plasma generating means 607, and so on. Also, according to need, publicly known air flow control means such as an air curtain, and publicly known heating means such as a lamp (not shown in the figure) are disposed.

The movable support mechanism 606, which supports the plasma generating means 607, moves in parallel with the rails 610a, 610b which are disposed in a carrying direction of the object 602 to be processed, and thereby, the plasma generating means 607 moves to a predetermined position. Also, the carrier table 603 moves on the rails 610a, 610b, and thereby, the object 602 to be processed moves. On the occasion of actually carrying out plasma processing, it is fine if the plasma generating means 607 and the object 602 to be processed, are moved relatively, and it would be also fine if one of them is stopped. Also, as for plasma processing which is actually carried out, it would be fine if plasma surface processing is carried out evenly on a whole surface of the object 602 to be processed, by moving the plasma generating means and the object to be processed, relatively over continuously generating plasma, and it would be also fine if plasma surface processing is carried out by generating plasma only at an arbitrary place of the object to be processed.

Subsequently, details of the plasma generating means 607 will be explained by use of FIG. 5(B). FIG. 5(B) is a perspective view which shows the plasma generating means 607 which has parallel flat plate electrodes.

In FIG. 5(B), arrows show paths of gas, and 611, 612 designate electrodes which comprise an electric conductive material typified by a metal having electric conductivity, such as aluminum and copper, and a first electrode 611 is connected to a power supply (high frequency power supply) 608. Meanwhile, it would be also fine if a cooling system (not shown in the figure) for circulating cooling water is connected to the first electrode 611. When the cooling system is disposed, prevented is heating in a case of continuously carrying out surface processing by circulation of cooling water, and improvement of efficiency due to continuous processing becomes possible. A second electrode 612 is identical in shape to the first electrode 611, and disposed parallelly. Also, the second electrode 612 is electrically grounded as shown in 613.

Meanwhile, it is desirable to cover a surface of at least one of this first electrode 611 or the second electrode 612 with a solid dielectric. As the solid dielectric, cited are metal oxide such as silicon dioxide, aluminum oxide, zirconium dioxide and titanium dioxide, plastic such as ethylenetelephthalate and polytetrafluoroethylene, compound oxide such as glass and barium titanate. It would be fine if a shape of the solid dielectric is a sheet form or a film form, but it is desirable that a thickness is 0.05 to 4 mm.

And, the first electrode 611 and the second electrode 612 form a line form narrow mouth for gas at lower end parts which are placed in parallel. In a space between both electrode of this first electrode 611 and the second electrode 612, process gas is supplied through a valve and piping 614 from gas supply means (gas cylinder) 609a. And, an atmosphere in the space between the both electrodes is replaced with the process gas, and in this status, when a high frequency voltage (10 to 500 MHz) is applied to the first electrode 611 by the high frequency power supply 608, plasma is generated in the space. And, when a reactive gas flow including a chemically active excitation seed such as ion and radical, which is generated by this plasma, is irradiated toward a surface of the object 602 to be processed (617), it is possible to carry out predetermined plasma surface processing on the surface of the object 602 to be processed. At this time, a distance of the surface of the object 602 to be processed and the narrow mouth which becomes an emission outlet of process gas is 3 mm or less, preferably 1 mm or less, more preferably 0.5 mm or less. In particular, it would also be fine if a sensor for measuring a distance is attached, and the distance of the surface of the object 602 to be processed and the narrow mouth which becomes the emission outlet of process gas is controlled. Meanwhile, gas for process, which is filled in the gas supply means (gas cylinder) 609a, is properly set up in tune with a type of surface processing which is carried out in a processing chamber. Also, discharged gas is collected in an air discharging system 609b through the piping 615, a filter (not shown in the figure) which removes dusts mixed in gas, and a valve. Further, these collected discharged gas is purified and circulated, to reuse the gas, and thereby, it is also possible to utilize the gas effectively.

The invention, which uses the plasma processing apparatus operating under atmospheric pressure or the vicinity of atmospheric pressure (means a pressure range of 5 Torr to 800 Torr.), does not require time for vacuuming and atmospheric air release, which are required in a decompressing apparatus, and does not require to dispose a complex vacuum system. In particular, in a case of using a large size substrate, a chamber also grows in size necessarily, and when an inside of the chamber runs into a reduced pressure status, processing time is required, and therefore, this apparatus, which is operated under atmospheric pressure or the vicinity of atmospheric pressure, is useful, and it becomes possible to reduce production cost.

From the foregoing, by carrying out etching of the electric conductive film, and ashing of the resist in the implementation mode 1 of the invention using the plasma processing apparatus rapid processing, in which a conventional air discharging procedure is omitted, became possible. Also, since an air discharging system is unnecessary, as compared to a case of using a conventional apparatus which has decompression processing, manufacture could be carried out with a reduced space.

A manufacturing process of the wiring pattern in the implementation mode 1 is a process which uses the line form droplet emitting apparatus and the plasma processing apparatus at the same time. It is also possible to use any one means and leave the other to conventional means, but having regard to space saving, rapid processing, low cost etc., it is desirable to use the above-described both apparatuses at the same time. Or, it would be also fine if it is combined with a method of using a dot form droplet emitting apparatus which will be cited in an implementation mode 2, and a local plasma processing apparatus.

(Implementation Mode 2)

An implementation mode 2 of the invention, by using a droplet emitting apparatus which has a droplet emitting head in which one or a plurality of droplet emitting holes are disposed and plasma generating means under atmospheric pressure or the vicinity of atmospheric pressure, manufactures a wiring pattern which is indispensable as a display device, on a glass substrate with a desired size using the plasma processing apparatus performing the local plasma processing. Hereinafter, the implementation mode 2 will be explained with reference to FIG. 6.

Firstly, by use of a publicly known method, for example, a sputter or CVD method (Chemical Vapor Deposition method), an electric conductive film, which becomes wiring, is film-formed on a substrate 1001 to be processed (FIG. 6(A)). Next, by use of a dot form droplet emitting apparatus which will be described later, a resist pattern 1003 is formed on apart where a wiring pattern is formed (FIG. 6(B)). The resist pattern 1003 is formed as a line form pattern, by overlapping droplets which are emitted from dot form droplet emitting holes, and then, emitting them. However, it is not limited to the line form, but it is also possible to form in an arbitrary pattern. Next, by use of the baked resist pattern as a mask, and by use of a plasma processing apparatus which will be described later, an conductive film 1002, which is not covered with the resist pattern 1003, is etched (FIG. 6(E) and FIG. 6(H)). The etching is carried out by scanning the plasma generating means, in such a manner that dot form plasma generating means comes to an arrow position in FIG. 6(H). At this time, as etching gas, used is gas which reacts with an electric conductive film. After the etching processing, ashing is applied to the remaining resist pattern 1003 by use of the dot form atmospheric pressure plasma processing apparatus, to remove it. Scanning of the plasma generating means at the time of ashing is carried out in the same manner as at the time of the etching. As a result, only an electric conductive film remains at a resist pattern forming place, and a wiring pattern is formed (FIG. 6(F)). Meanwhile, as gas at the time of ashing, used is oxygen with high reactivity. Also, it would be fine if reactivity is more heightened by use of fluorinated acid series gas.

Figure 21:
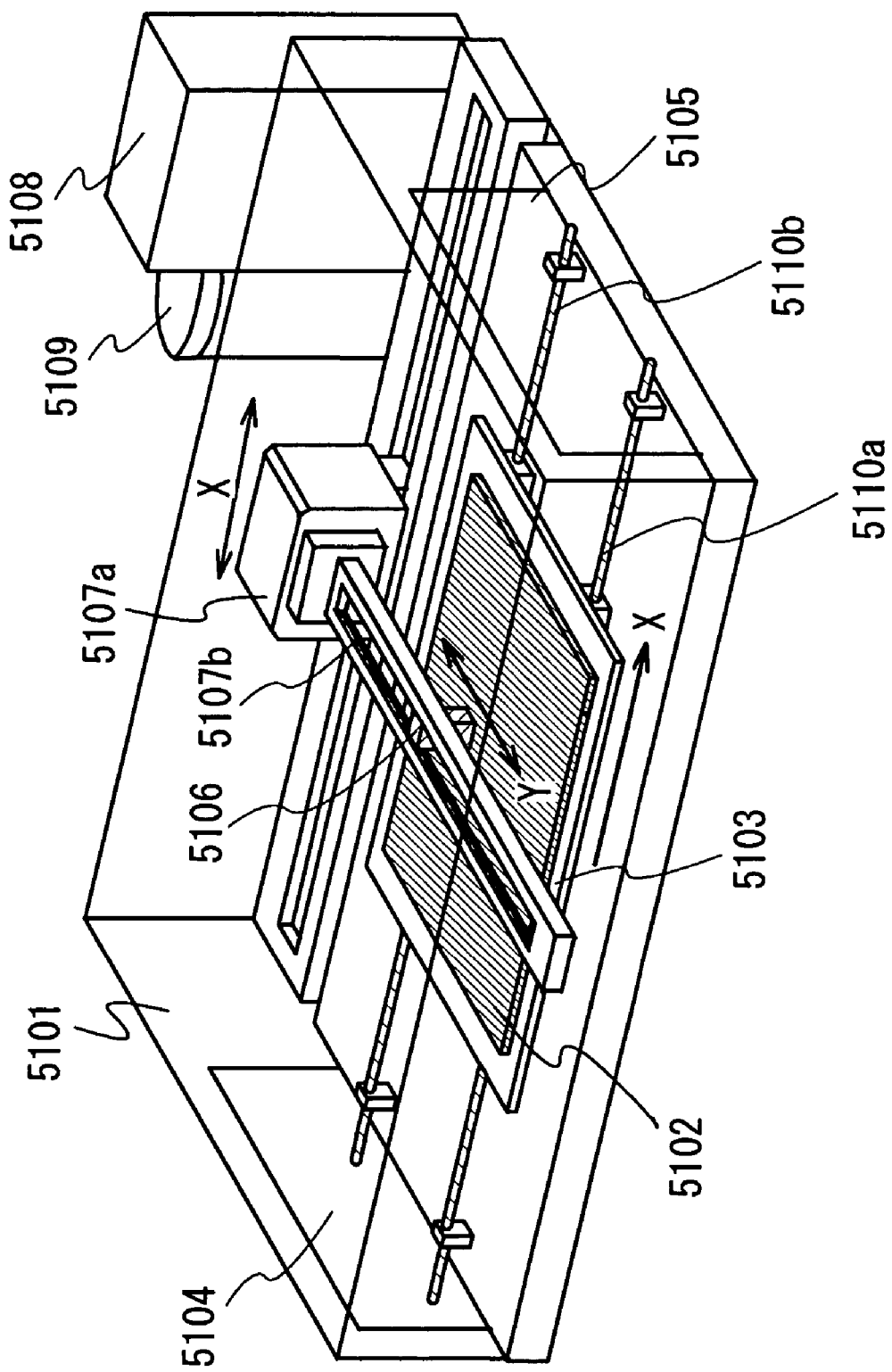
FIG. 21 is a perspective view which shows a configuration of a dot form droplet emitting apparatus of the invention.
Figure 22:
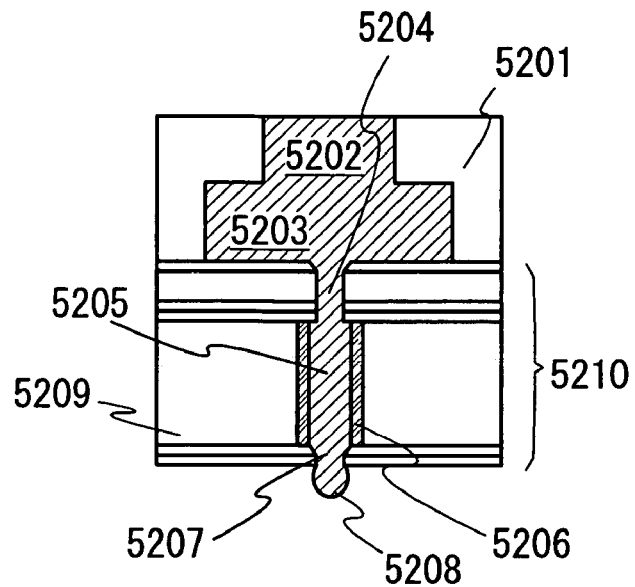
FIGS. 22(A) and 22(B) are views which show a droplet emitting part of the dot form droplet emitting apparatus of the invention.
Figure 22:
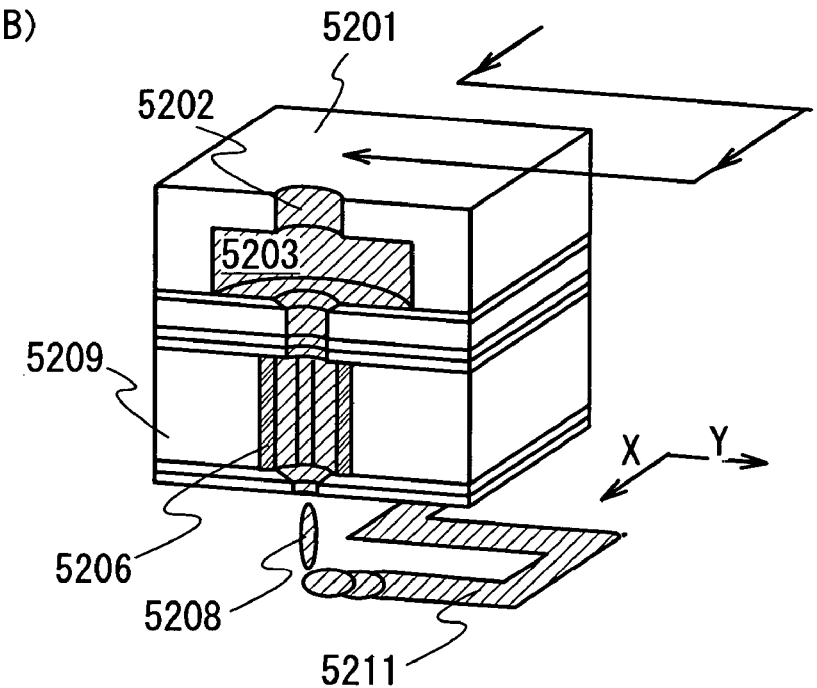
Figure 23:
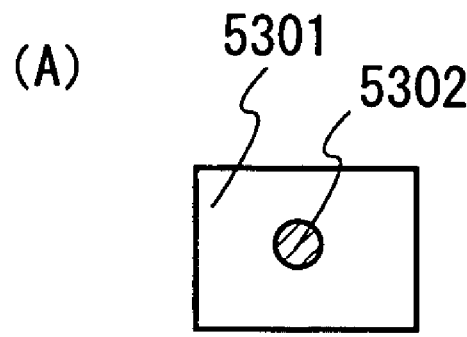
FIGS. 23(A) to 23(C) are views which show a bottom surface of the droplet emitting part of the dot form droplet emitting apparatus of the invention.
Figure 23:
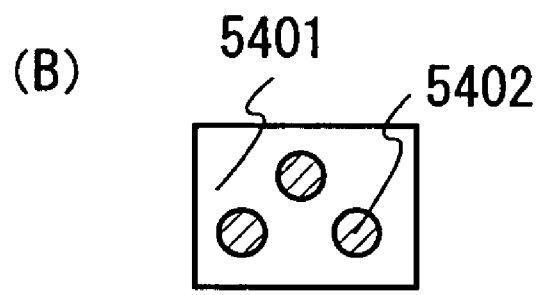
Figure 23:
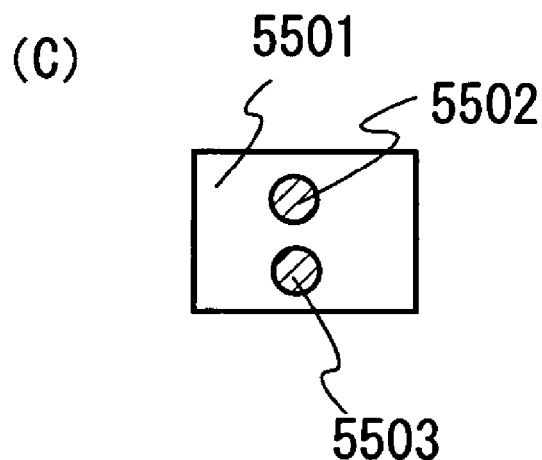

Hereinafter, a droplet emitting apparatus used in the implementation mode 2, which has a droplet emitting head in which one or a plurality of droplet emitting holes are disposed, will be described with reference to FIGS. 21 to 23. FIG. 21 is schematic perspective view which shows as to one configuration example of the dot form droplet emitting apparatus, and also, FIG. 22, FIG. 23 are views which shows as to the head part used for this dot form droplet emitting apparatus, in which nozzles are disposed.

The dot form droplet emitting apparatus shown in FIG. 21 has a head 5106 in the apparatus, and droplets are emitted by the head 5106, and thereby, a desired droplet pattern is obtained on a substrate 5102. In the dot form droplet emitting apparatus, as the substrate 5102, it is possible to apply to an object to be processed such as a resin substrate typified by a plastic substrate, or a semiconductor wafer typified by silicon, in addition to the glass substrate with a desired size.

In FIG. 21, the substrate 5102 is carried from a carry-in entrance 5104 in an inside of a housing 5101, and the substrate, for which droplet emission processing is finished, is carried out from a carry-out outlet 5105. In the inside of the housing 5101, the substrate 5102 is mounted on a carrier table 5103, and the carrier table 5103 moves on rails 5110a, 5110b which connect the carry-in entrance and the carry-out outlet.

Head support parts 5107a and 5107b are a mechanism which supports a head 5106 which emits droplets, and moves the head 5106 to an arbitrary position in an X-Y plane. The head support part 5107a moves in an X direction which is in parallel with the carrier table 5103, and the head 5106, which is mounted on the head support part 5107b fixed to the head support part 5107a, moves in a Y direction which is perpendicular to the X direction. When the substrate 5102 is carried in an inside of the housing 5101, at the same time as this, the head support part 5107a and the head 5106 move in the X, Y directions, respectively, and are set up to an initial predetermined position for carrying out droplet emission processing. The movement of the head support part 5107a and the head 5106 to an initial position is carried out at the time of substrate carry-in, or at the time of substrate carry-out, and thereby, it is possible to carry out emission processing effectively.

The droplet emission processing is started when the substrate 5102 reaches to a predetermined position, by the movement of the carrier table 5103. The droplet emission processing is accomplished by a combination of relative movement of the head support part 5107a, the head 5106 and the substrate 5102, and droplet emission from the head 5106 which is supported by the head support part. By adjusting moving speed of the substrate, the head support part and the head, and a cycle for emitting droplets from the head 5106, it is possible to draw a desired droplet pattern on the substrate 5102. In particular, the droplet emission processing requires high accuracy, and therefore, it is desirable that movement of the carrier table 5103 is stopped at the time of droplet emission, and only the head support part 5107a and the head 5106 with high controllability are scanned. It is desirable to select a drive system with high controllability, such as a servo motor and a pulse motor, for drive of the head 5106 and the head support part 5107a. Also, respective scanning of the head 5106 and the head support part 5107a in an X-Y direction is not limited to only one direction, but it would be fine if the droplet emission processing is carried out, by carrying out to-and-from or repetition of to-and-from. By the above-described movement of the object to be processed and the head support part, it is possible to emit droplets to a whole area of the substrate.

The droplets are supplied from a droplet supply part 5109 which is disposed outside the housing 5101, to an inside of the housing, and further, supplied through the head support parts 5107a, 5107b to a liquid chamber in an inside of the head 5106. This droplet supply is controlled by control means 5108 which is disposed outside the housing 5101, but may be controlled by control means which is built in the head support part 5107a in the inside of the housing.

The control means 5108 has major functions such as movement of the carrier table, the head support part and the head, and control of droplet emission which responds to this movement, in addition to the above-described control of droplet supply. Also, it is possible to download data of pattern drawing by droplet emission, from an outside of the apparatus through software such as CAD, and these data are inputted by methods of a graphic input and a coordinate input, etc. Also, a mechanism for detecting a remaining amount of a composition which is used as droplets is disposed in the inside of the head 5106, to transfer information which shows the remaining amount to the control means 5108, and thereby, an automatic remaining amount warning function may be added.

Although it is not described in FIG. 1, further, it would be fine if a sensor for alignment of the substrate and the pattern on the substrate, means for introducing gas into the housing, air discharging means for the inside of the housing, means for carrying out heat treatment for the substrate, means for irradiating light to the substrate, and in addition, means for measuring various values of physicality such as temperature and pressure are also disposed according to need. Also, it is also possible to control these means collectively by the control means 5108 which is disposed outside the housing 5101. Further, if the control means 5108 is connected to a production management system etc. by a LAN cable, wireless LAN, an optical fiber, etc., it becomes possible to uniformly manage processes from an outside, which results in improving productivity.

Next, a configuration of the inside of the head 5106 will be explained. FIG. 22(A) is a cross-section view of the head 5106 of FIG. 21, which is in parallel with the Y direction, and FIG. 22(B) is a perspective view which shows a scanning direction of the head 5106, together with an example of wiring formation due to droplet emission.

In FIG. 22(A), droplets which are supplied from an outside to an inside of a head 5201, after they pass through a liquid chamber flow path 5202 and are stored in an auxiliary liquid chamber 5203, move to a nozzle 5209 for emitting droplets. A nozzle part is composed of a fluid resistance part 5204 which is disposed so as for moderate droplets to be loaded in the nozzle, a compressing chamber 5205 for compressing droplets and emitting them to an outside of the nozzle, and a droplet emitting hole 5207.

On a side wall of the compressing chamber 5205, disposed is a piezoelectric element 5206 which has PIEZO electric effect, such as titanic acid.zirconium acid.lead($Pb(Zr, Ti)O_3$) deformed by applied voltage. On this account, by applying a voltage to the piezoelectric element 5206 which is disposed on a target nozzle, the piezoelectric element is transformed, and an inner volume of the compressing chamber 5205 is lowered, and thereby, droplets are pushed out, and it is possible to emit a droplet 5208 to an outside.

In the invention, the droplet emission is carried out by a so-called PIEZO system which uses a piezoelectric element, but depending on a material of droplets, a so-called thermal ink-jet system, in which a heating element is heated to generate air bubbles and to push out droplets, may be used. In this case, it becomes such a configuration that the piezoelectric element 5206 is replaced with the heating element.

Also, in a nozzle part 5210 for droplet emission, a wet property between droplets and the liquid chamber flow path 5202, the auxiliary liquid chamber 5203, the fluid resistance part 5204, the compressing chamber 5205, and further, the droplet emitting hole 5207 becomes important. On that account, it would also be fine if a carbon film, a resin film, etc. (not shown in the figure) for adjusting the wet property with a material is formed in respective flow paths.

By the above-described means, it is possible to emit droplets on a processed substrate. In the droplet emitting system, there are a so-called sequential system (dispenser system) in which droplets are emitted continuously to form a continuous line form pattern, and a so-called on-demand system in which droplets are emitted in a dot form manner, and in an apparatus configuration in the invention, the on-demand system was shown, but it is also possible to use a head by use of the sequential system.

FIG. 22(B) is a perspective view which shows a scanning example at the time of droplet emission of the head 5201. Since the head 5201 can move arbitrarily in X and Y directions, it is also possible to form a key type wiring pattern 5211 as shown in FIG. 22(B), by emitting droplets while overlapping them in a dot form. As a matter of course, in an area where there is no necessity to emit droplets, it is also possible not to emit droplets by not inputting an signal to the piezoelectric element 5205.

(A) to (C) of FIG. 23 are things which represent typically a bottom part of the head in FIG. 22. FIG. 23(A) is of such a basic arrangement that one droplet emitting hole 5302 is disposed on a bottom surface of the head 5301. In contrast to this, in FIG. 23(B), it is of a so-called cluster form arrangement in which the droplet emitting holes 5402 on a head bottom part 5401 are increased to three points so as to configure a triangle. If the head 5401 as shown in FIG. 23(B) is used, it is possible to draw a plurality of continuous patterns etc., and also, to emit droplets to a plurality of places at the same time, or with an interval of time, and therefore, it becomes possible to reduce a scanning amount of the head. Also, in FIG. 23(C), it is of such an arrangement that droplet emitting holes are disposed above and below. In this arrangement, after droplet emission from upper droplet emitting hole 5502, similar droplets are emitted to a similar place from a lower droplet emitting hole 5503 with an interval of time, and therefore, before droplets on the substrate, which have been already emitted, are dried and solidified, it is possible to further accumulate identical droplets thickly. Also, in a case that clogging occurred in the upper droplet emitting hole, it is also possible to function the lower droplet emitting hole as backup.

Further, by disposing the emitting hole 5207 at a slant to the object 5102 to be processed, it would be also fine if droplets are emitted at a slant to the object to be processed. It would be also fine if the slant is slanted by a slanting mechanism with which the head 5106 or the head support part 5107a is equipped, and it would be also fine if a shape of the droplet emitting hole 5207 in the head 5106 is tapered, and droplets are emitted in a slanted manner. By the above-described slanted emission of droplets, a wet property with droplets which are emitted to a surface of the object 5102 to be processed is controlled, and thereby, it becomes possible to control shapes of droplets at the time when they landed in the object to be processed.

As a composition which is used as droplets of the above-described dot form droplet emitting apparatus, it is possible to use the same thing as the thing which was shown in the implementation mode 1. Also, the dot form droplet emitting apparatus of the invention can carry out under atmospheric pressure or the vicinity of atmospheric pressure (5 Torr to 800 Torr). In particular, it is also possible to the above-described droplet emitting apparatus to carry out emission of droplets under positive pressure of an extent of 800 Torr.

By use of the above-described dot form droplet emitting apparatus, the resist pattern 1003 is formed, and thereby, a resist is used only for a necessary place for forming a wiring pattern, and therefore, as compared to a spin coating method which is used in the prior art, it becomes possible to dramatically reduce quantity of the resist consumed.

Figure 24:
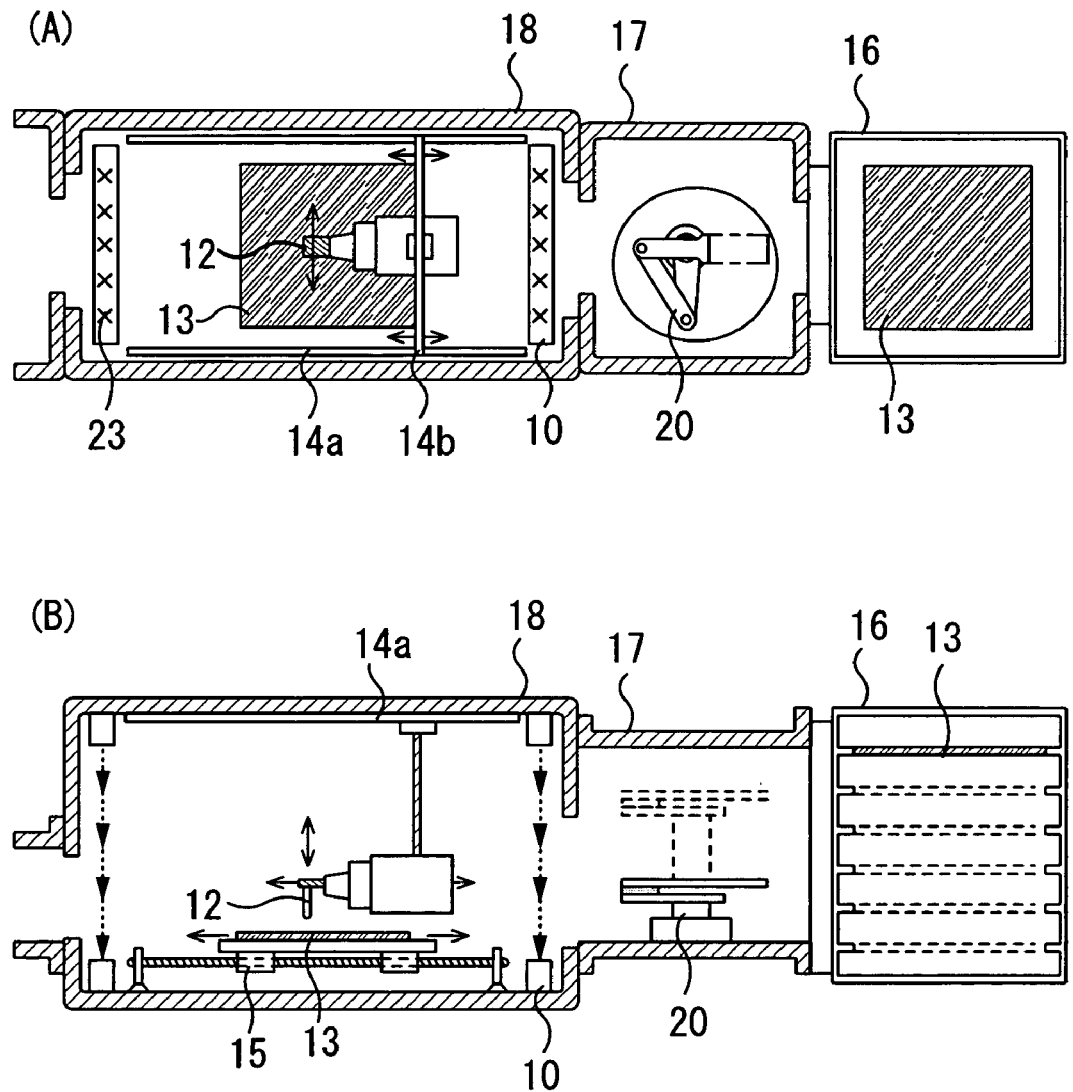
FIGS. 24(A) to (B) are perspective views which shows a configuration of an atmospheric pressure plasma processing apparatus of the invention.

Next, a plasma processing apparatus, which is used in the implementation mode 2, will be explained with reference to FIG. 24. FIG. 24(A) is a top view of one example of the plasma processing apparatus which is used in the invention, and FIG. 24(B) is a cross-section view. In these figures, in a cassette chamber 16, an object 13 to be processed, such as a glass substrate with a desired size, and a resin substrate typified by a plastic substrate, is set. As a carrying system of the object 13 to be processed, horizontal carrying is cited, but in a case of using a meter square substrate of a fifth generation or later, with the aim of reduction of an occupied area of a carrying machine, vertical carrying with a substrate being placed vertically may be carried out.

In a carrier chamber 17, the object 13 to be processed, which is disposed in the cassette chamber 16, is carried in a plasma processing chamber 18 by a carrier mechanism (robot arm) 20. In the plasma processing chamber 18 which is located next to the carrier chamber 17, provided are air flow control means 10, plasma generating means 12 which has a cylindrical electrode, rails 14a, 14b for moving the plasma generating means 12, moving means 15 for carrying out movement of the object 13 to be processed, and so on. Also, the well-known heating means (not shown in the figure) such as a lamp is provided, if necessary.

The air flow control means 10 is a thing which aimes at dust control, and carries out control of an air flow so as to be shielded from outside air, by use of inert gas which is emitted from a blowout outlet 23. The plasma generating means 12 moves to a predetermined position, by the rail 14a which is disposed in a carrying direction of the object 13 to be processed, and also, the rail 14b which is disposed in a direction which is perpendicular to the carrying direction. Also, the object 13 to be processed moves in the carrying direction by the moving means 15. On the occasion of actually carrying out plasma processing, any one of the plasma generating means 12 or the object 13 to be processed may be moved.

Figure 25:
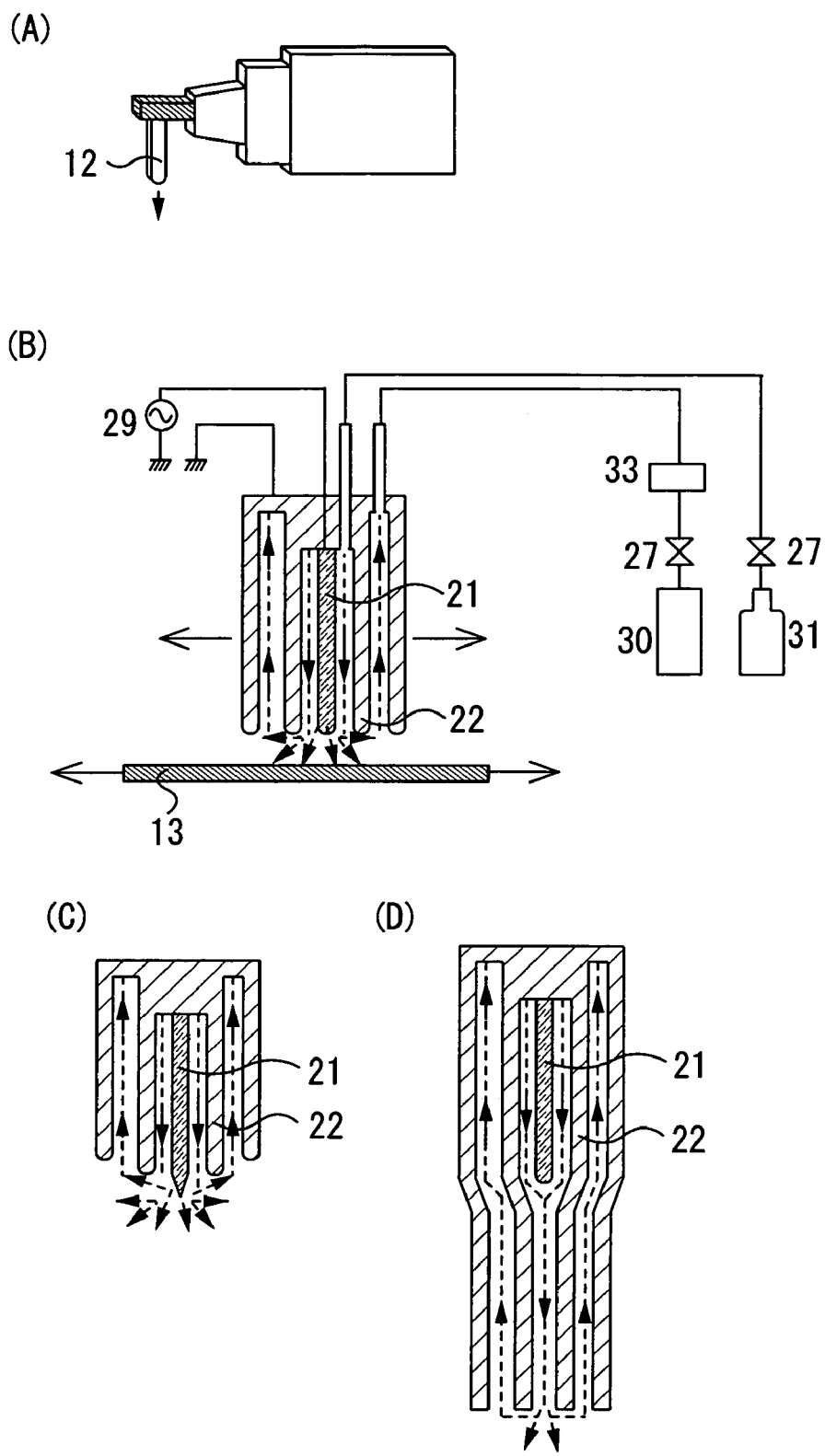
FIGS. 25(A) to (D) are views which shows a configuration of a plasma generating part of the atmospheric pressure plasma processing apparatus of the invention.

Then, details of the plasma generating means 12 will be explained by use of FIG. 25. FIG. 25(A) shows a perspective view of the plasma generating means 12 which has a cylindrical electrode, and FIGS. 25(B) to (D) show cross-section views of the cylindrical electrode.

In FIG. 25(B), dotted lines show paths of gas, and 21, 22 designate electrodes which comprise a material having electric conductivity, such as aluminum and copper, and a first electrode 21 is connected to a power supply (high frequency power supply) 29. Meanwhile, it would be also fine if a cooling system (not shown in the figure) for circulating cooling water is connected to the first electrode 21. When the cooling system is disposed, prevented is heating in a case of continuously carrying out surface processing, by circulation of cooling water, and improvement of efficiency due to continuous processing becomes possible. A second electrode 22 has a shape surrounding a periphery of the first electrode 21, and is electrically grounded. And, the first electrode 21 and the second electrode 22 have cylindrical forms having nozzle form narrow mouths for gas, at their front edge. In a space between both electrodes of this first electrode 21 and the second electrode 22, process gas is supplied through a valve 27 from gas supply means (gas cylinder) 31. And, an atmosphere in the space is replaced and in this status, when a high frequency voltage (10 to 500 MHz) is applied to the first electrode 21 by the high frequency power supply 29, plasma is generated in the space. And, when a reactive gas flow including a chemically active excitation seed such as ion and radical, which is generated by this plasma, is irradiated toward a surface of the object 13 to be processed, it is possible to carry out local plasma surface processing at a predetermined position, on the surface of the object 13 to be processed. At this time, a distance between the surface of the object 13 to be processed and the narrow mouth which becomes an emission outlet of process gas is 3 mm or less, preferably 1 mm or less, more preferably 0.5 mm or less. In particular, it would be also fine if a sensor for measuring a distance is attached, and the distance between the surface of the object 13 to be processed and the narrow mouth which becomes the emission outlet of process gas is controlled.

Meanwhile, gas for process, which is filled in the gas supply means (gas cylinder) 31, is properly set up in tune with a type of surface processing which is carried out in a processing chamber. Also, discharged gas is collected in an air discharging system 30 through a filter 33 for removing dusts mixed in gas, and the valve 27. Further, these collected discharged gas are purified and circulated, to reuse the gas, and thereby, it is also possible to utilize the gas effectively.

Also, a cylindrical form plasma generating means 12, which has a different cross-section from FIG. 25(B), is shown in FIG. 25(C)(D). FIG. 25(C) has such a shape that the first electrode 21 is longer than the second electrode 22, and the first electrode 21 is of an acute angle, and also, FIG. 25(D) has such a shape that an ionized gas flow, which is generated between the first electrode 21 and the second electrode 22, is emitted to an outside.

The invention, which uses the plasma processing apparatus operating under atmospheric pressure or the vicinity of atmospheric pressure (means a pressure range of 5 Torr to 800 Torr.), does not require time for vacuuming and atmospheric air release, which are required in a decompressing apparatus, and does not require to dispose a complex vacuum system. In particular, in a case of using a large size substrate, a chamber also grows in size necessarily, and when an inside of the chamber runs into a reduced pressure status, processing time is required, and therefore, this apparatus, which is operated under atmospheric pressure or the vicinity of atmospheric pressure, is useful, and it becomes possible to reduce production cost.

From the foregoing, by carrying out etching of the electric conductive film, and ashing of the resist in the implementation mode 2 of the invention, rapid processing, in which a conventional air discharging procedure is omitted, becomes possible. Also, since an air discharging system is unnecessary, as compared to a case of using a conventional apparatus which has decompression processing, manufacture could be carried out with a reduced space.

A manufacturing process of the wiring pattern in the implementation mode 2 is a process which uses the line form droplet emitting apparatus and the plasma processing apparatus at the same time. It is also possible to use either means and leave the other to conventional means, but having regard to space saving, rapid processing, low cost, etc., it is desirable to use the dot form droplet emitting means of the invention, and the atmospheric pressure plasma processing means of the invention at the same time. Or, it would be also fine if it is combined with a method of using the line form droplet emitting apparatus which is cited in an implementation mode 1, and the local plasma processing apparatus.

(Implementation Mode 3)

An implementation mode 3 of the invention is, in the same manner as the implementation mode 1, a thing which manufactures a wiring pattern on a glass substrate with a desired size, and characterized in that it uses only the plasma processing apparatus without using the line form droplet emitting means, unlike the implementation mode 1. Meanwhile, here, the plasma processing apparatus, which is cited in the implementation mode 1, is used, but the plasma processing apparatus for carrying out local plasma processing, which was cited in the implementation mode 2, may be used.

Figure 7:
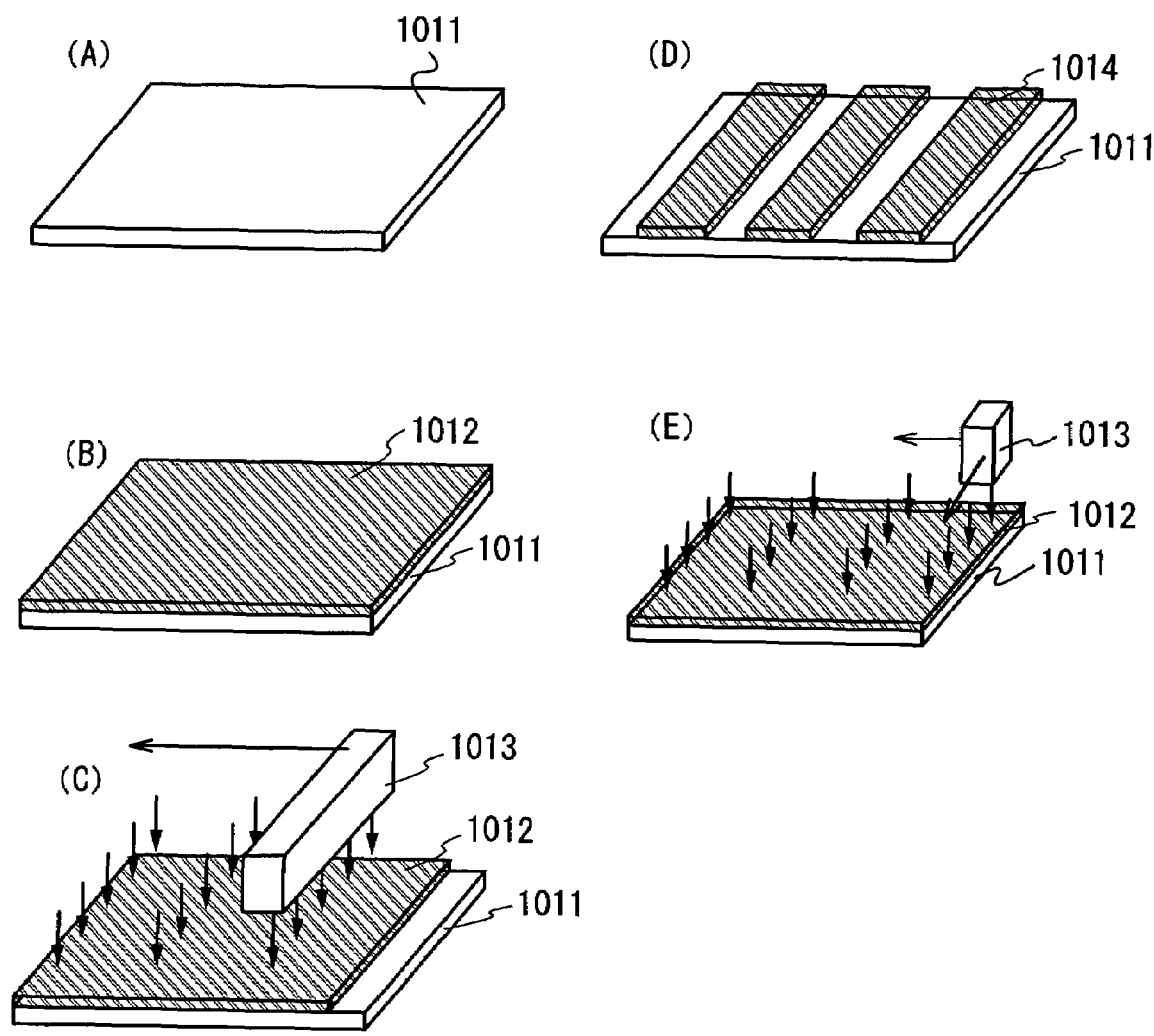
FIG. 7 is a typical perspective view of a processing process which uses the invention.

Firstly, by use of a publicly known sputter processing method, an electric conductive film 1012, which becomes wiring, is film-formed on a substrate 1011 to be processed (FIGS. 7(A), (B)). Next, by use of the plasma processing apparatus used in the implementation modes 1, 2, which has plasma generating means under atmospheric pressure or the vicinity of atmospheric pressure, the electric conductive film 1012 is selectively etched (FIG. 7(C)). The etching is carried out by generating plasma only at a place of an electric conductive formed film to which etching is carried out, over relatively moving the substrate 1011 to be processed and the plasma generating means 1013 in a direction of an arrow (left direction in the figure) in FIG. 7(C). Meanwhile, in a case of using the plasma processing apparatus for carrying out local plasma processing, plasma is generated to carry out etching, as shown in FIG. 7(E).

As above, by separating the electric conductive film in a pattern form, a wiring 1014 is formed (FIG. 7(D)).

In the implementation mode 3 of the invention, it is possible to simplify processes, by such a portion that a forming process of a resist pattern, which was shown in the implementation modes 1, 2, is omitted. However, since the resist pattern does not exist, an edge of a wiring which is formed is influenced a great deal by a diameter of a process gas emitting hole of an atmospheric pressure plasma processing apparatus. Therefore, the implementation mode 3 is suitable for formation of a wiring pattern which has a scale of such an extent that this influence is negligible.

By the above-described manufacturing process of the wiring pattern, in the same manner as the implementation modes 1, 2, rapid processing becomes possible, in which an conventional air discharging procedure is omitted across an entire chamber. Also, since the air discharging system is unnecessary, as compared to a case of using a conventional apparatus which has depression processing, manufacture could be carried out with a reduced space.

(Implementation Mode 4)

An implementation mode 3 of the invention is, in the same manner as the implementation modes 1, 2, 3, a thing which manufactures a wiring pattern on a glass substrate of a desired size, and characterized in that, after a groove is formed in a wiring forming part, droplets are emitted to this groove portion by use of a line form droplet emitting apparatus or a dot form droplet emitting apparatus, of the invention.

Firstly, on a substrate 1021 to be processed, an insulating film 1022 for forming a groove is film-formed by use of a publicly known thermal oxidation process or a CVD method (Chemical Vapor Deposition method) etc. (FIGS. 8(A), (B)). The insulating film 1022 may be an inorganic insulating film such as a silicon oxide film and a silicon nitride film, and may be also an organic insulating film such as acrylic and polyimide.

Figure 8:
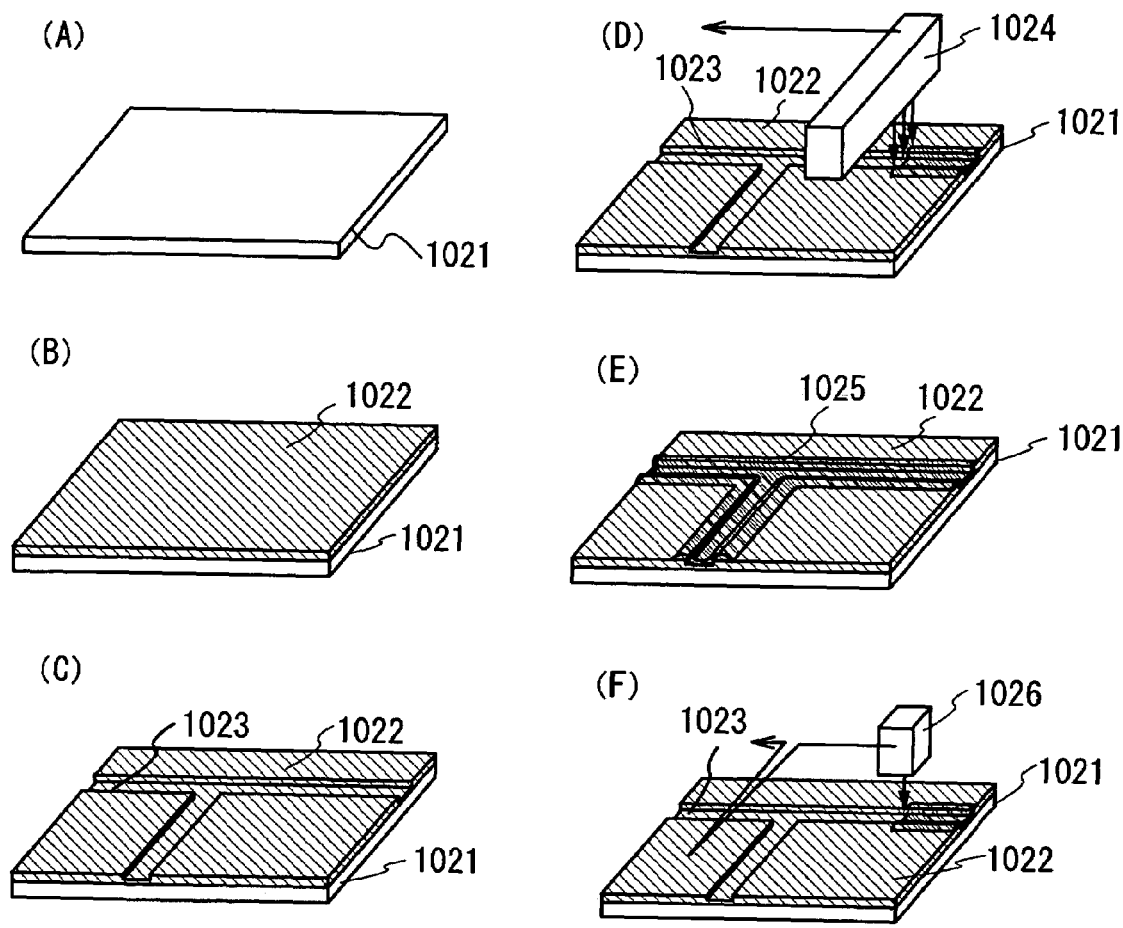
FIG. 8 is a typical perspective view of a processing process which uses the invention.

Next, by use of a publicly known photolithography process, a groove 1023 is formed on the insulating film 1022 (FIG. 8(C)). The groove 1023 is a depression which is disposed, on the occasion of emitting droplets, which are a wiring material for preventing them from being expanded from a land-in place at later time, and formed so as to become a shape of a wiring pattern. In the groove forming in the insulating film 1022, it would be fine if the insulating film 1022, which is comparable to an area for carrying out groove formation, is removed completely, and it would also be fine if the insulating film is remained under the groove forming area.

The groove 1023 may be formed in a line form, and may be also a circular depression. In particular, in forming the circular depression, an electric conductive film is disposed under the insulating film 1022, and the insulating film in the depression forming area is removed completely, and thereby, it is also used as a contact hole to an electric conductive film under the insulating film 1022. A side wall of the groove 1023 may have a tapered angle, and may be also perpendicular to a surface of an object to be processed.

So as to fill this groove 1023, by use of the line form droplet emitting apparatus or the dot form droplet emitting apparatus, droplets of a wiring material are emitted. A droplet emitting head 1024 of the line form droplet emitting apparatus scans relatively to the substrate 1021 to be processed, as shown by an arrow in FIG. 8(D), and in the same manner, a droplet emitting head 1026 of the dot form droplet emitting apparatus scans relatively to the substrate 1021 to be processed as shown by an arrow in FIG. 8(F). Droplets are emitted only from a droplet emitting hole in a droplet emitting head which is necessary for filling droplet in the groove 1023 (FIG. 8(D), FIG. 8(F)). As a result of that, the groove part 1023 is filled with droplets, and a wiring pattern 1025 is drawn (FIG. 8(E)).

By designing a width and a depth of the groove part 1023 in tune with a diameter of droplet, it is possible to fill the groove part with droplets, with high accuracy. There is a necessity to design the width and the depth of the groove part 1023, having regard to a material of droplets.

By the above-described wiring pattern forming process, in the same manner as the implementation modes 1, 2, rapid processing, in which a conventional air discharging procedure is omitted, becomes possible. Also, since an air discharging system is unnecessary, as compared to a case of using a conventional apparatus which has depression processing, manufacture can be carried out with a reduced space. Further, in the implementation mode 4, since the groove is formed in a wiring forming part, it becomes possible to use a material with low viscosity, for the droplet emitting head of the line form droplet emitting apparatus and the dot form droplet emitting apparatus. Further, it is also possible to manufacture a processing surface with high flatness, by selecting a droplet material, a work dimension of the groove part, etc. in an appropriate manner.

(Implementation Mode 5)

An implementation mode 5 of the invention is characterized in that a droplet emitting apparatus is used for improving adhesion between laminated films, to draw a matrix form pattern. Meanwhile, the droplet emitting apparatus, which is used here, is either the line form droplet emitting apparatus or the dot for droplet emitting apparatus.

Figure 9:
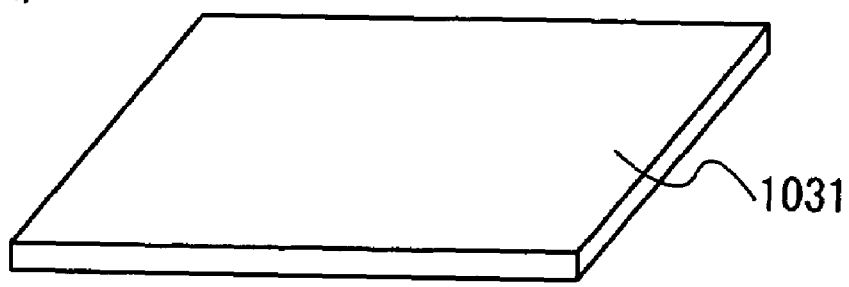
FIGS. 9(A) to 9(C) are typical perspective views of a processing process which uses the invention.
Figure 9:
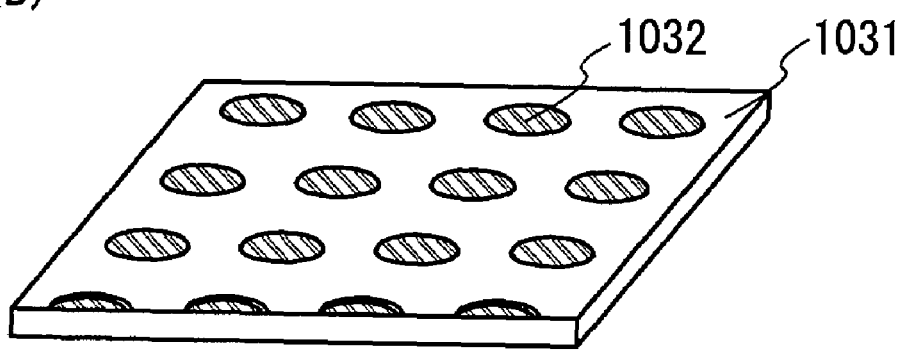
Figure 9:
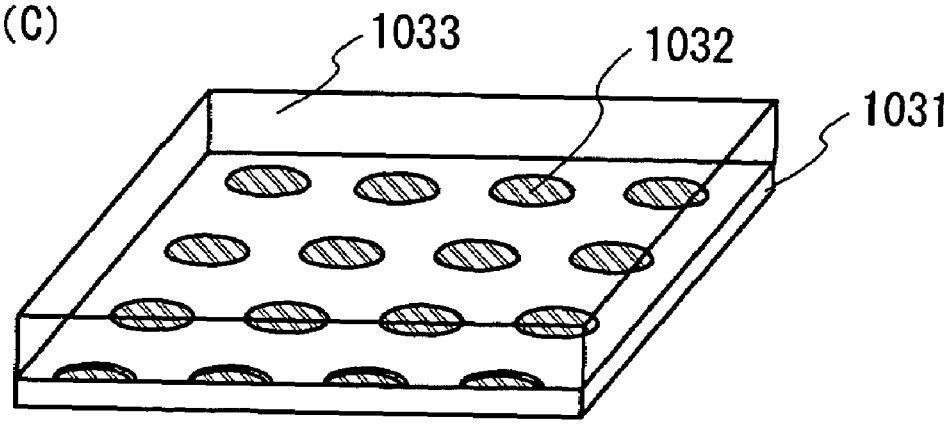

With reference to FIG. 9, the process will be explained. On a substrate 1031 to be processed, droplets 1032 are emitted in a matrix form, by use of a droplet emitting apparatus (FIGS. 9(A),(B)). The substrate 1031 to be processed may be a glass substrate, and may be also a substrate which has a laminated film. Subsequently, on the substrate 1031 to be processed and the droplets 1032, a thin film 1033 is laminated. The thin film 1033 may be an inorganic thin film such as a silicon oxide film and a silicon nitride film, and may be also an organic thin film. Also, the thin film 1033 may be an organic planarized film, and may be also an alignment film or a seal material, which are applied in a post-process of LCD panels.

As above, by forming a matrix form pattern by use of the line form droplet emitting apparatus or the dot form droplet emitting apparatus, it becomes possible to improve adhesion between laminated films.

EMBODIMENT 1

A manufacturing method of a display device of the invention, which uses a droplet emitting apparatus which has a droplet emitting head in which a plurality of droplet emitting holes are disposed in a line form, and a plasma processing apparatus which has plasma generating means under atmospheric pressure or the vicinity of atmospheric pressure, will be explained. Hereinafter, with reference to the drawings, embodiments of the invention will be described. An embodiment 1 of the invention is a manufacturing method of a channel stop type thin film transistor (TFT).

Figure 10:
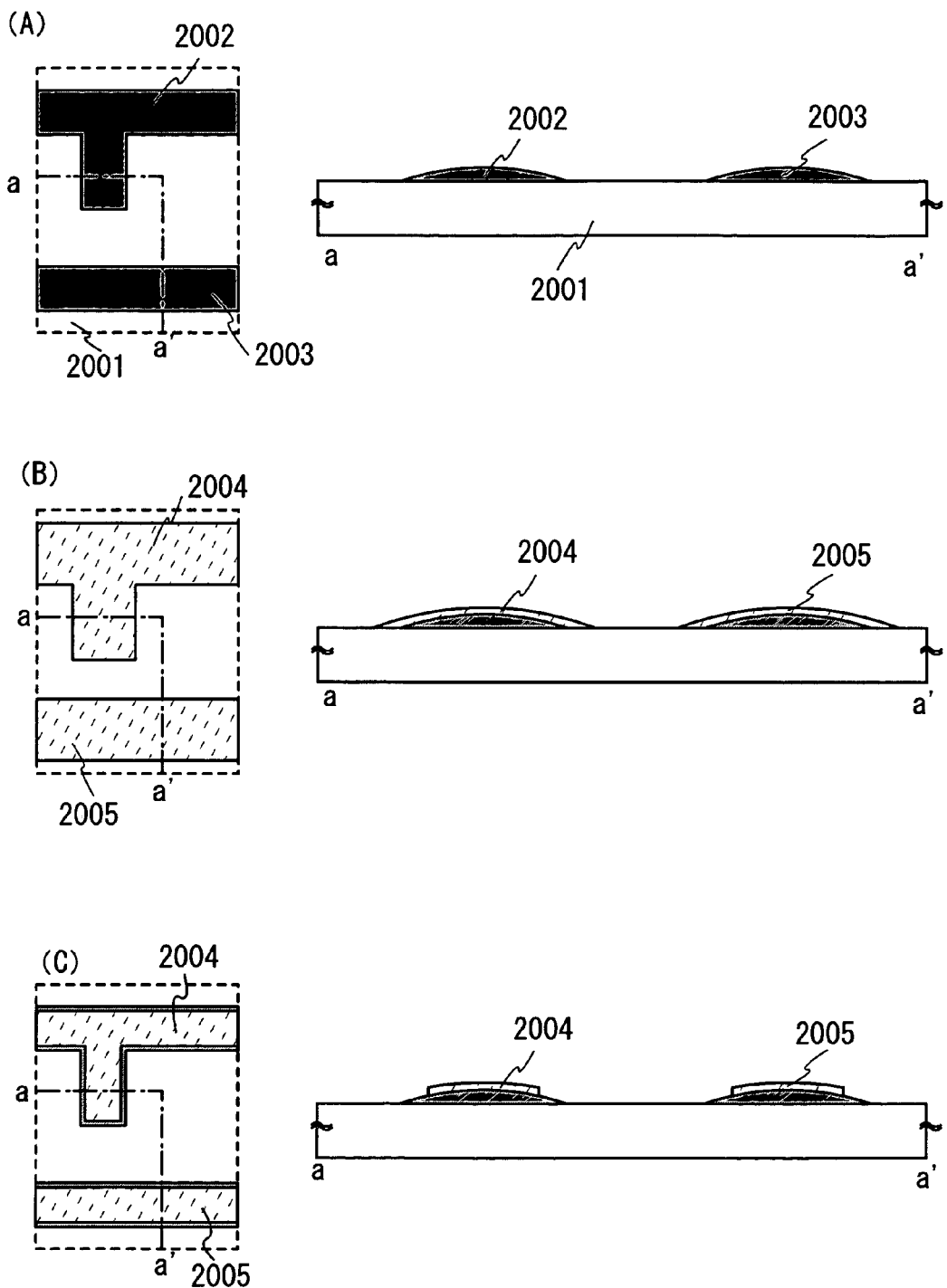
FIGS. 10(A) to (C) are pattern diagrams of manufacturing processes which relates to an embodiment 1 of the invention, and left diagrams are top views, and right diagrams are cross-section views of a-a' of the left diagrams, respectively.

On a substrate 2001 to be processed, which uses various materials such as glass, quartz, semiconductor, plastic, plastic film, metal, glass epoxy resin, and ceramic, a composition having publicly known electric conductivity is emitted on a necessary place, by use of a line form droplet emitting apparatus of the invention, and thereby, a gate electrode and wiring 2002, a capacitance electrode and wiring 2003 are formed (FIG. 10(A)). It is desirable that a line width of the gate electrode and wiring 2002 is drawn with a range of 5 to 50 μm.

Next, by applying heat treatment etc. to the substrate on which the gate electrode and wiring 2002, the capacitance electrode and wiring 2003 were formed, liquid solution of droplets is evaporated, to increase viscosity of its composition. Meanwhile, the heat treatment may be carried out at any time such as at the time of droplet emission due by to the line form droplet emitting apparatus, after droplet emission in an arbitrary area, or after all processes are finished.

Subsequently, by use of the line form droplet emitting apparatus, resists 2004, 2005 are emitted so as to cover the gate electrode and wiring 2002, the capacitance electrode and wiring 2003, which have been emitted in the above-described process (FIG. 10(B)).

After that, by use of a publicly known photolithography process, the resists are patterned (FIG. 10(C)). Meanwhile, on the occasion of emitting resists by the line form droplet emitting apparatus, a resist pattern may be formed directly, by the line form droplet emitting apparatus, without using the publicly known photolithography process.

Figure 11:
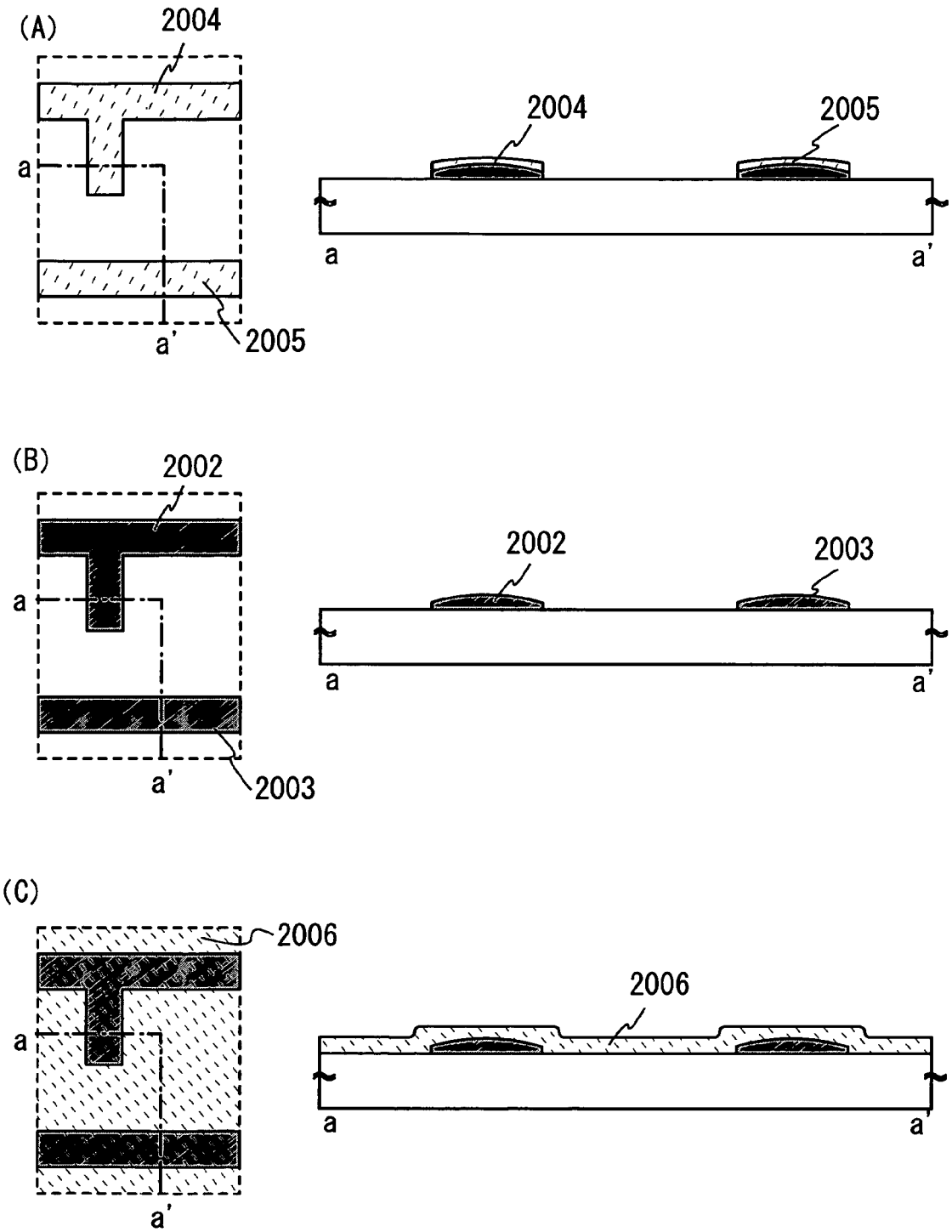
FIGS. 11(A) to (C) are pattern diagrams of manufacturing processes which relates to the embodiment 1 of the invention, and left diagrams are top views, and right diagrams are cross-section views of a-a' of the left diagrams, respectively.

Next, by use of the above-described plasma processing apparatus which has plasma generating means under atmospheric pressure, line form plasma is formed, and etching of the gate electrode and wiring 2002, and the capacitance electrode and wiring 2003 is carried out, and thereafter, by use of an atmospheric pressure plasma apparatus of the invention in the same manner, the resist is removed by ashing (FIGS. 11(A), (B)).

By the above-described processes, the gate electrode and wiring 2002, and the capacitance electrode and wiring 2003 are formed. Meanwhile, as a material for forming the gate electrode and wiring 2002, and the capacitance electrode and wiring 2003, it is possible to use an electric conductive material such as molybdenum (Mo), titanium (Ti), tantalum (Ta), tungsten (W), chromium (Cr), aluminum (Al), copper (Cu), aluminum (Al) including neodymium (Nd) etc., and a laminated layer of these or alloy.

After that, by use of a publicly known method such as a CVD method (Chemical Vapor Deposition method), a gate insulating film 2006 is formed (FIG. 11(C)). In this embodiment, as the gate insulating film 2006, a silicon nitride film is formed by the CVD method under atmospheric pressure, but it would be also fine if a silicon oxide film or a laminated layer configuration of these is formed.

Further, by use of a publicly known method (sputtering method, LP (reduced pressure) CVD method, plasma CVD method, etc.), an active semiconductor layer 2007 is film-formed with a thickness of 25 to 80 nm (preferably, 30 to 60 nm). The active semiconductor layer 2007 is an amorphous semiconductor film typified by an amorphous silicon film, and is formed on a whole surface of the substrate 2001 to be processed.

Figure 12:
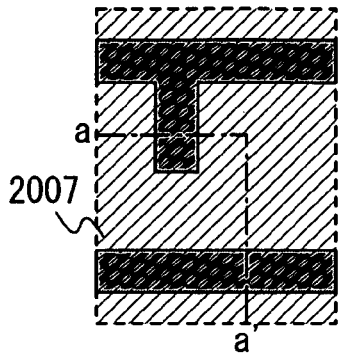
FIGS. 12(A) to (C) are pattern diagrams of manufacturing processes which relates to the embodiment 1 of the invention, and left diagrams are tops views, and right diagrams are cross-section views of a-a' of the left diagrams, respectively.
Figure 12:
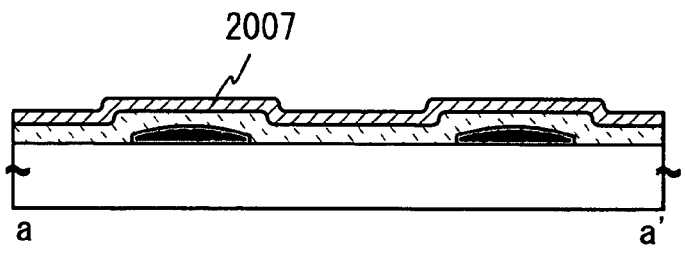
Figure 12:
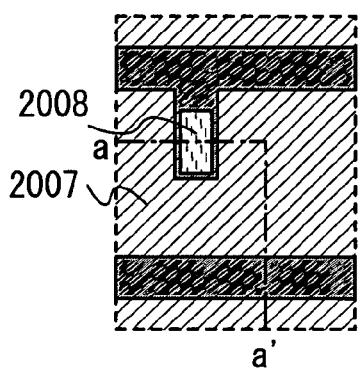
Figure 12:
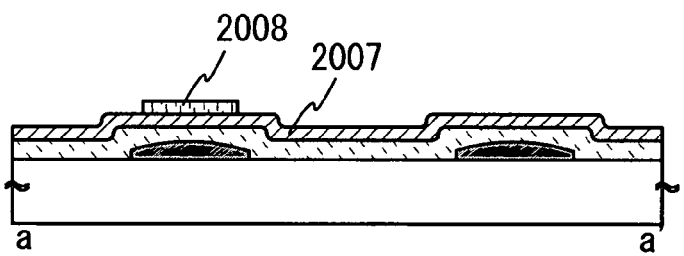
Figure 12:
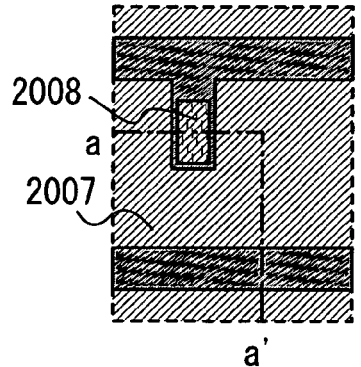
Figure 12:
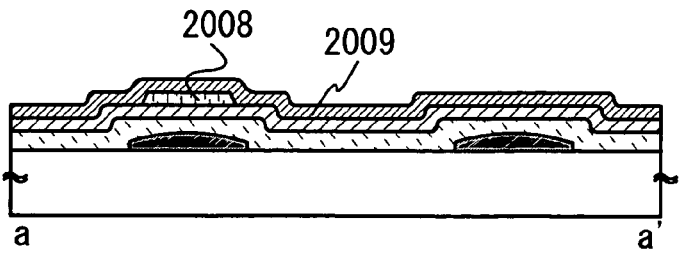

Next, after a silicon nitride film etc. is formed on a whole surface of the substrate to be processed, patterning is carried out and thereby, a channel protective film (etching stop film) 2008 is formed (FIG. 12(B)). For formation of the channel protective film 2008, it would be fine if a resist is emitted by use of the line form droplet emitting apparatus, and it would be also fine if a publicly known photolithography process is used.

Subsequently, an amorphous semiconductor film 2009, in which an impurity element for giving n-type electric conductivity is added, is formed on a whole surface of the substrate to be processed (FIG. 12(C)).

Figure 13:
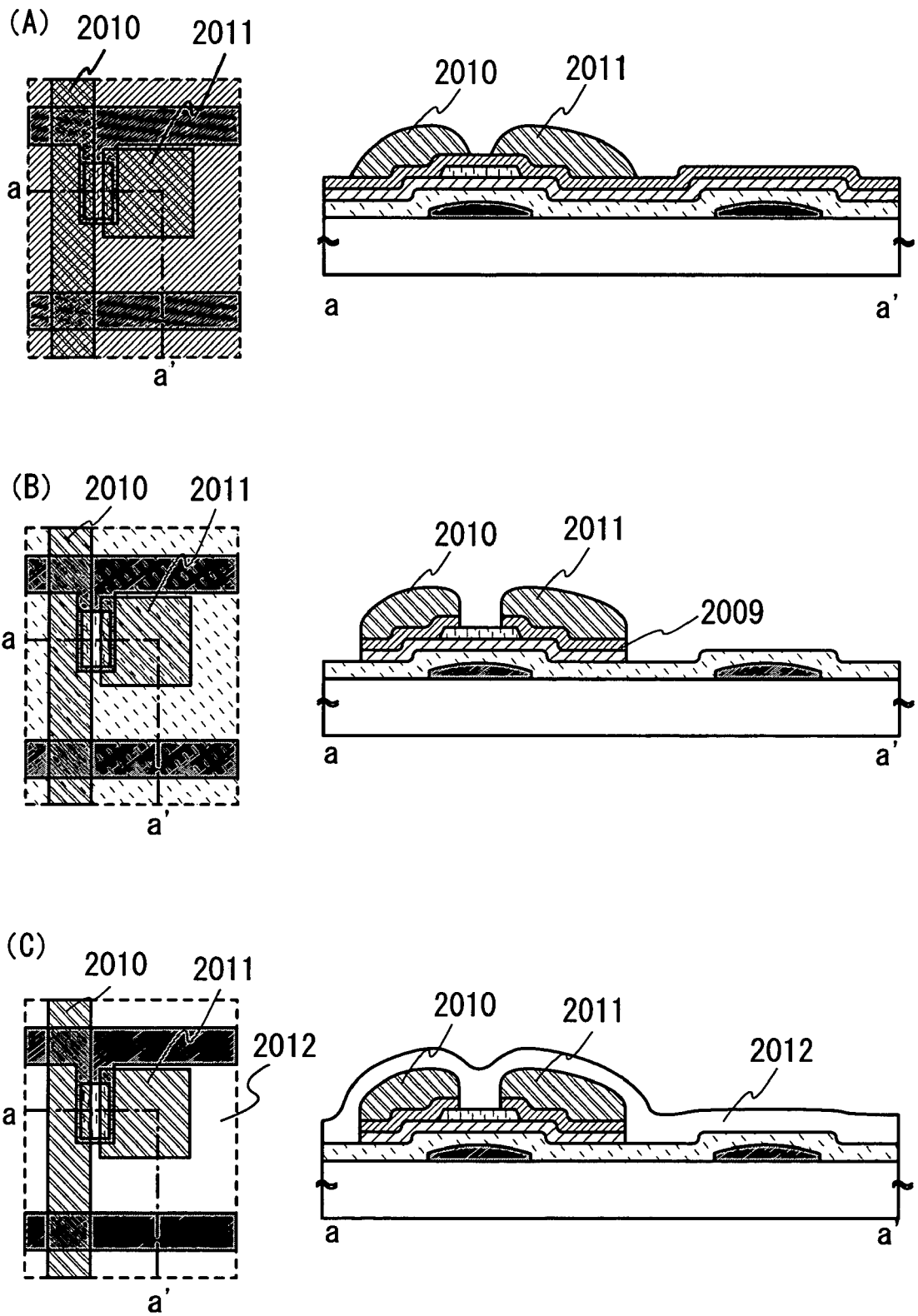
FIGS. 13(A) to (C) are pattern diagrams of manufacturing processes which relates to the embodiment 1 of the invention, and left diagrams are top views, and right diagrams are cross-section views of a-a' of the left diagrams, respectively.

After that, by use of the line form droplet emitting apparatus of the invention, source/drain electrodes and wirings 2010, 2011 are formed (FIG. 13(A)). Meanwhile, the source/drain electrodes and wirings 2010, 2011 may be patterned in the same manner as the gate electrode and wiring 2002, and the capacitance electrode and wiring 2003, which are shown in FIG. 10(A) through FIG. 11(B). A line width of the source/drain electrodes and wirings 2010, 2011 is drawn with a range of 5 to 25 µm. As a material for forming the source/drain electrodes and wirings 2010, 2011, it is possible to use an electric conductive material such as molybdenum (Mo), titanium (Ti), tantalum (Ta), tungsten (W), chromium (Cr), aluminum (Al), copper (Cu), aluminum (Al) including neodymium (Nd) etc., and a laminated layer of these or alloy, in the same manner as the gate electrode, wiring.

After that, by use of the source/drain electrodes and wirings 2010, 2011 as a mask, the amorphous semiconductor film 2009, in which an impurity element for giving n-type electric conductivity is added, and the active semiconductor layer 2007 are etched by forming line form plasma through the use of the plasma processing apparatus which has plasma generating means under atmospheric pressure, and by scanning this (FIG. 13(B)). In a channel forming part, the active semiconductor layer 2007 under the channel protective film (etching stop film) 2008 is not etched, by the channel protective film (etching stop film) 2008.

Further, by use of a publicly known method such as a CVD method, a protective film 2012 is formed (FIG. 13(C)). In this embodiment, as the protective film 2012, a silicon nitride film is formed under atmospheric pressure by the CVD method, but it would be also fine if a silicon oxide film or a laminated layer configuration of these is formed. Also, it is possible to use an organic resin film such as an acrylic film.

After that, after a resist is emitted by the line form droplet emitting apparatus, the resist is patterned by a publicly known photolithography process (not shown in the figure). Further, by use of the plasma processing apparatus which has plasma generating means under atmospheric pressure, line form plasma is formed, and etching of the protective film 2012 is carried out, and a contact hole 2013 is formed (FIG. 14(A)). It is desirable that a diameter of the contact hole 2013 is formed with an range of 2.5 to 30 µm, by adjusting a gas flow and a high frequency voltage, etc. to be applied between electrodes.

Figure 14:
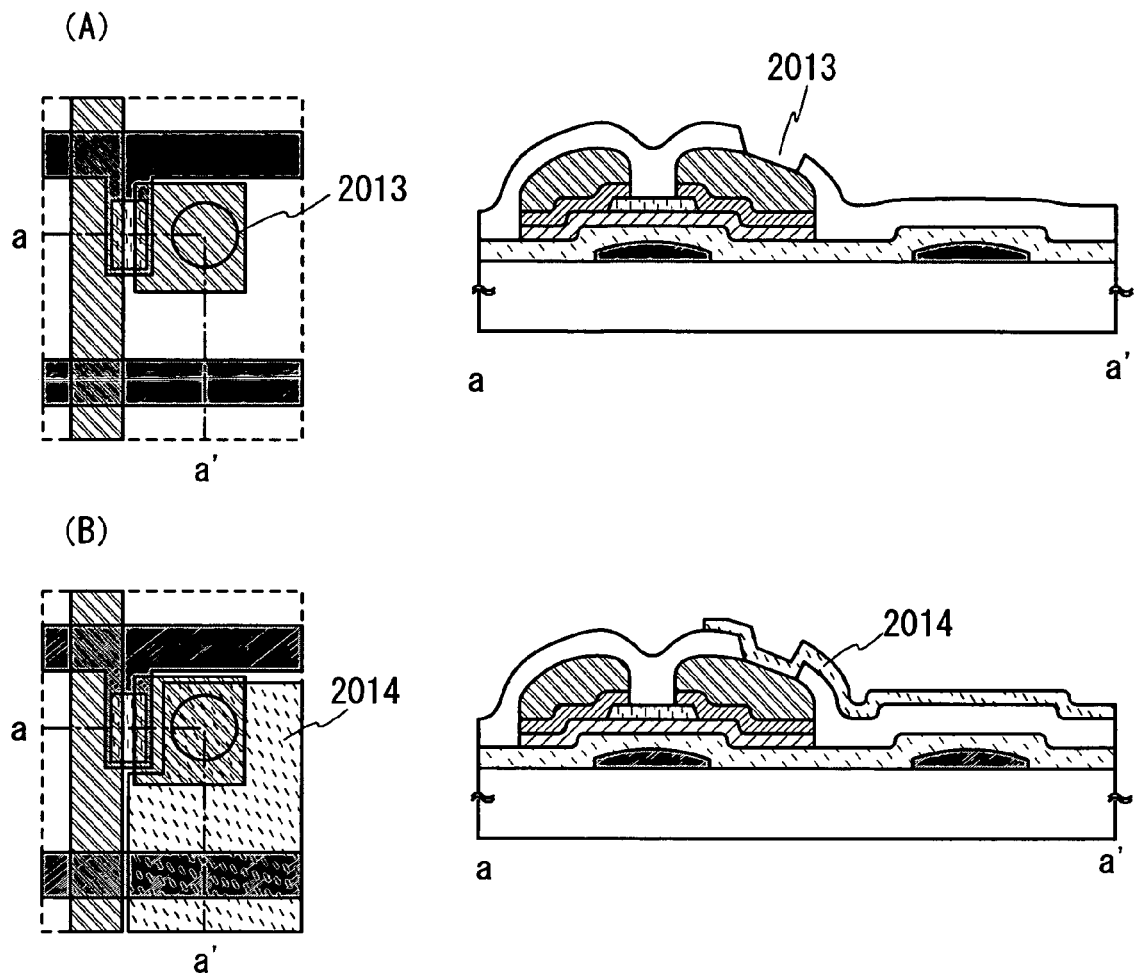
FIGS. 14(A) to 14(B) are pattern diagrams of manufacturing processes which relates to the embodiment 1 of the invention, and left diagrams are top views, and right diagrams are cross-section views of a-a' of the left diagrams, respectively.

After that, by the line form droplet emitting apparatus, a pixel electrode 2014 is formed (FIG. 14(B)). The pixel electrode 2014 may be drawn directly by the line form droplet emitting apparatus, and may be also formed by carrying out patterning in the same manner as the gate electrode and wiring 2002, and the capacitance electrode and wiring 2003, which are shown in FIG. 10(A) through FIG. 11(B). As a material of the pixel electrode 2014, it is possible to use a transparent electric conductive film such as ITO (indium oxide tin oxide alloy), indium oxide zinc oxide alloy ($In_2O_3$—ZnO), and zinc oxide (ZnO), or an electric conductive material such as molybdenum (Mo), titanium (Ti), tantalum (Ta), tungsten (W), chromium (Cr), aluminum (Al), copper (Cu), aluminum (Al) including neodymium (Nd) etc., and a laminated layer of these or alloy.

In the embodiment 1, a manufacturing example of the channel stop type thin film transistor was shown, but it is needless to say that a channel etch type thin film transistor, which does not use a channel stop film, may be manufactured by the above-described apparatus.

Meanwhile, without limiting to the above-described configuration, by use of a plasma processing method which has a droplet emitting apparatus which has a droplet emitting head in which one or a plurality of droplet emitting holes are disposed, and a plasma generating mechanism under atmospheric pressure or the vicinity of atmospheric pressure, for carrying out local plasma processing, it is also possible to manufacture a display device of the invention in the same manner.

EMBODIMENT 2

A manufacturing method of a display device of the invention, which uses the above-described droplet emitting apparatus which has the droplet emitting head in which the circular droplet emitting holes are disposed in a line form, and the plasma processing apparatus which has the plasma generating means under atmospheric pressure or the vicinity of atmospheric pressure, will be explained. In this embodiment, it is characterized by manufacturing a thin film transistor (TFT), without using a photolithography process which uses a resist mask at all. Hereinafter, with reference to the drawings, an embodiment of the invention will be explained. An embodiment 2 of the invention is a manufacturing method of a channel stop type thin film transistor (TFT).

Figure 15:
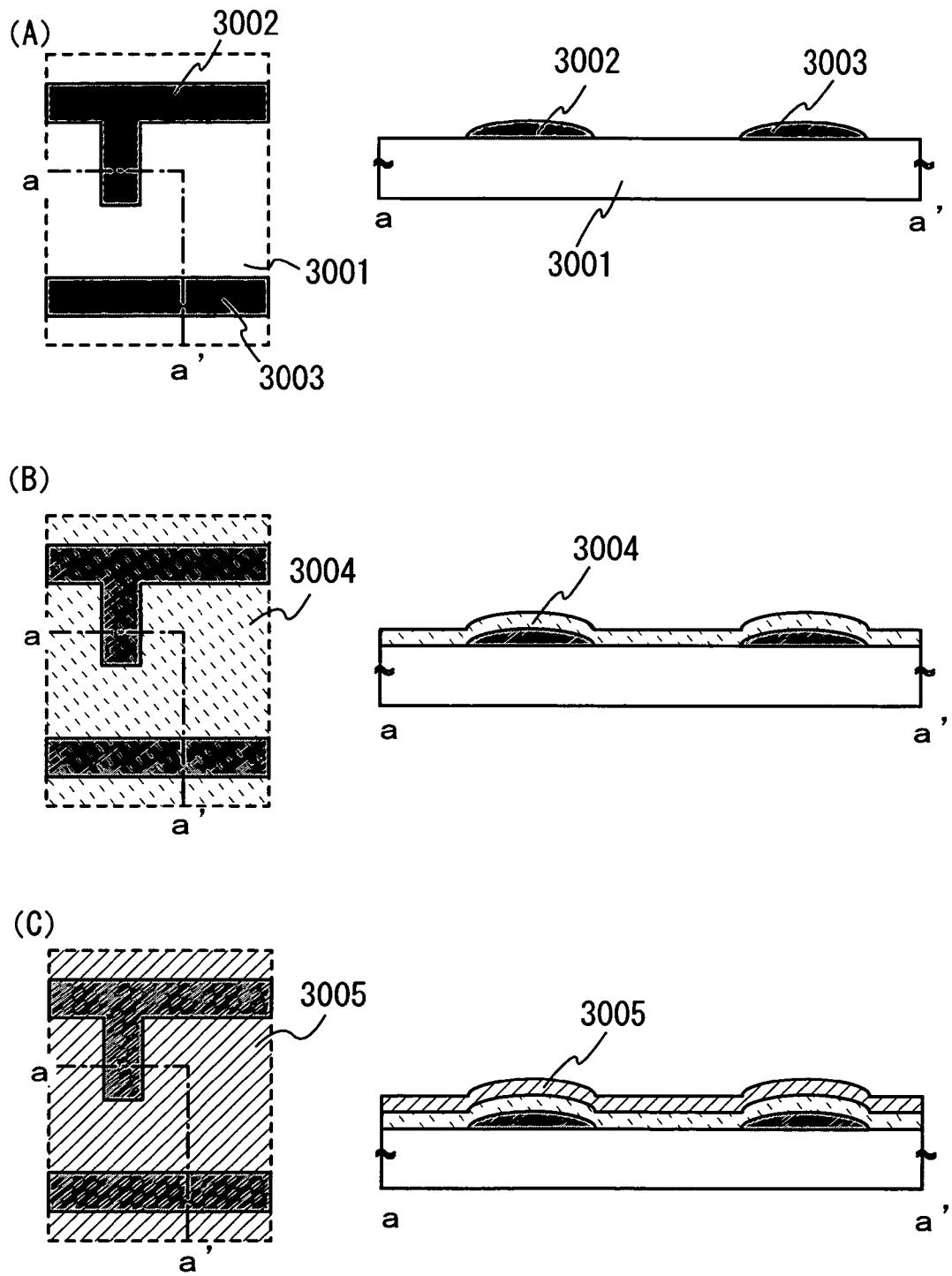
FIGS. 15(A) to (C) are pattern diagrams of manufacturing processes which relates to the embodiment 2 of the invention, and left diagrams are top views, and right diagrams are cross-section views of a-a' of the left diagrams, respectively.

On a substrate 3001 to be processed, which uses various materials such as glass, quartz, semiconductor, plastic, plastic film, metal, glass epoxy resin, and ceramic, a composition having publicly known electric conductivity is emitted on a necessary place, by use of a line form droplet emitting apparatus of the invention, and thereby, a gate electrode and wiring 3002, a capacitance electrode and wiring 3003 are formed (FIG. 15(A)). It is desirable that a line width of the gate electrode and wiring 3002 is drawn with a range of 5 to 50 µm.

Next, by applying heat treatment etc. to the substrate on which the gate electrode and wiring 3002, the capacitance electrode and wiring 3003 are formed, liquid solution of droplets is evaporated, to decrease viscosity of its composition. Meanwhile, the heat treatment may be carried out at any time such as at the time of droplet emission by the line form droplet emitting apparatus, after droplet emission in an arbitrary area, or after all processes are finished.

In this embodiment, it is characterized by directly using a pattern of a composition which is drawn by the line form droplet emitting apparatus, as the gate electrode and wiring, without carrying out a photolithography process.

By the above-described process, the gate electrode and wiring 3002, the capacitance electrode and wiring 3003 are formed. Meanwhile, as a material which forms the gate electrode and wiring 3002, the capacitance electrode and wiring 3003, it is possible to use an electric conductive material such as molybdenum (Mo), titanium (Ti), tantalum (Ta), tungsten (W), chromium (Cr), aluminum (Al), copper (Cu), aluminum (Al) including neodymium (Nd) etc., and a laminated layer of these or alloy.

After that, by use of a publicly known method such as a CVD method (Chemical Vapor Deposition method), a gate insulating film 3004 is formed (FIG. 15(B)). In the embodiment, as the gate insulating film 3004, a silicon nitride film is formed by the CVD method under atmospheric pressure, but it would be also fine if a silicon oxide film or a laminated layer configuration of these is formed.

Further, by use of a publicly known method (sputtering method, LP (reduced pressure) CVD method, plasma CVD method, etc.), an active semiconductor layer 3005 is film-formed with a thickness of 25 to 80 nm (preferably, 30 to 60 nm). The active semiconductor layer 3005 is an amorphous semiconductor film typified by an amorphous silicon film, and formed on a whole surface of the substrate 3001 to be processed (FIG. 15(C)).

Figure 16:
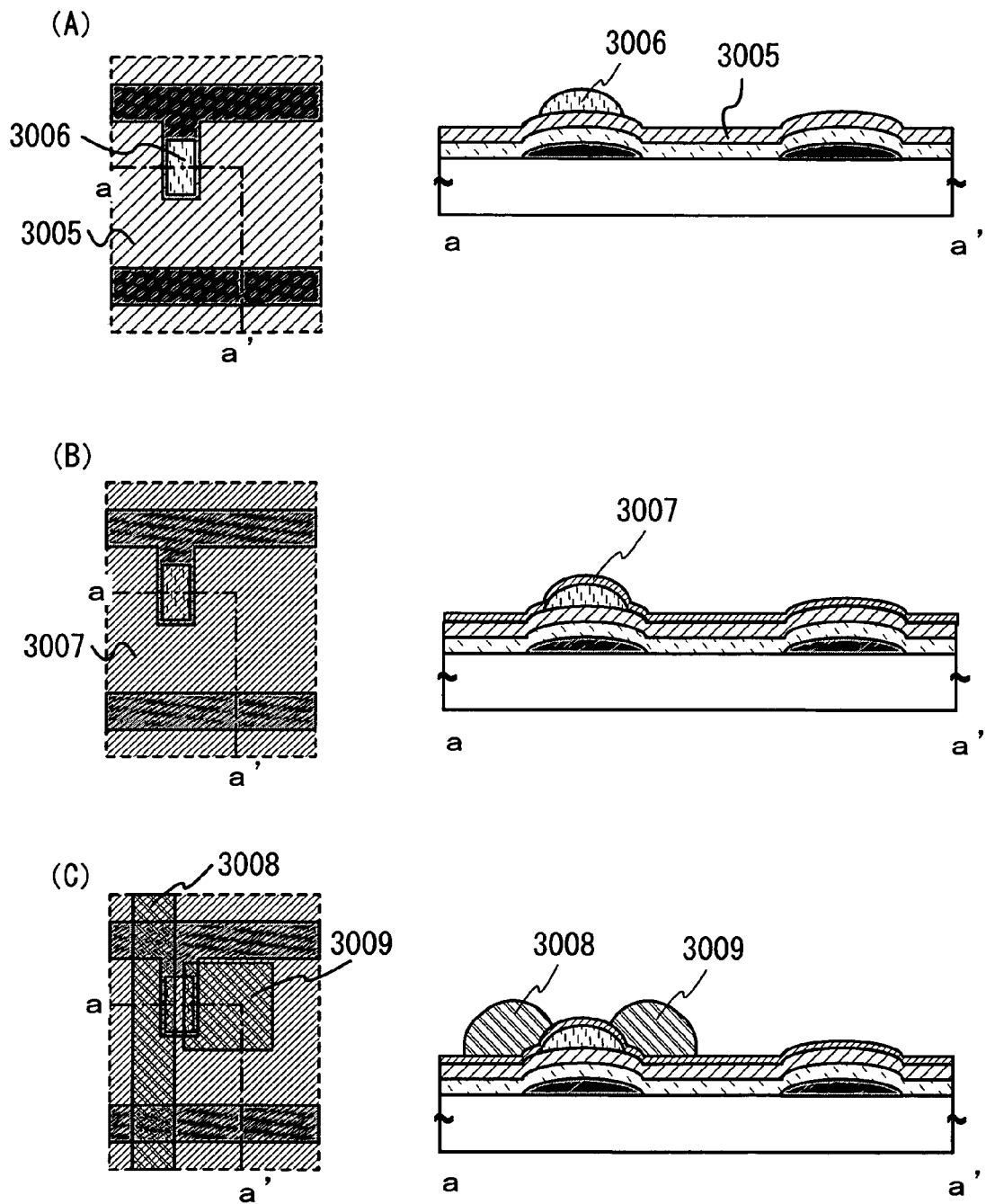
FIGS. 16(A) to (C) are pattern diagrams of manufacturing processes which relates to an embodiment 2 of the invention, and left diagrams are top views, and right diagrams are cross-section views of a-a' of the left diagrams, respectively.

Next, a channel protective film (etching stop film) 3006 is formed in a channel forming area of the substrate to be processed (FIG. 16(A)). For formation of the channel protective film 3006, a composition having a characteristic of high resistance of an organic resin film etc. such as polyimide and acrylic films, is emitted by use of the line form droplet emitting apparatus. Also, for the channel protective film, it would be also fine if silica glass which is widely used as SOG (Spin On Glass) solution, alkyl-siloxane-polymer, alkyl-silsesquioxane-polymer (MSQ), hydrogenated silsesquioxane-polymer (HSQ), hydrogenated alkyl-sulsesquioxane-polymer (HOSP), etc. are used.

Subsequently, an amorphous semiconductor film 3007, in which an impurity element for giving n-type electric conductivity is added, is formed on a whole surface of the substrate to be processed (FIG. 16(B)).

After that, by use of the line form droplet emitting apparatus of the invention, source/drain electrodes and wirings 3008, 3009 are formed (FIG. 16(C)). Also in this case, a wiring pattern is formed by emitting droplets, which become a wiring, directly to the substrate to be processed, and therefore, a photolithography process is not necessary. A line width of the source/drain electrodes and wirings 3008, 3009 is drawn with a range of 5 to 25 μm. As a material for forming the source/drain electrodes and wirings 3008, 3009, it is possible to use an electric conductive material such as molybdenum (Mo), titanium (Ti), tantalum (Ta), tungsten (W), chromium (Cr), aluminum (Al), copper (Cu), aluminum (Al) including neodymium (Nd) etc., and a laminated layer of these or alloy, in the same manner as the gate electrode, wiring.

Figure 17:
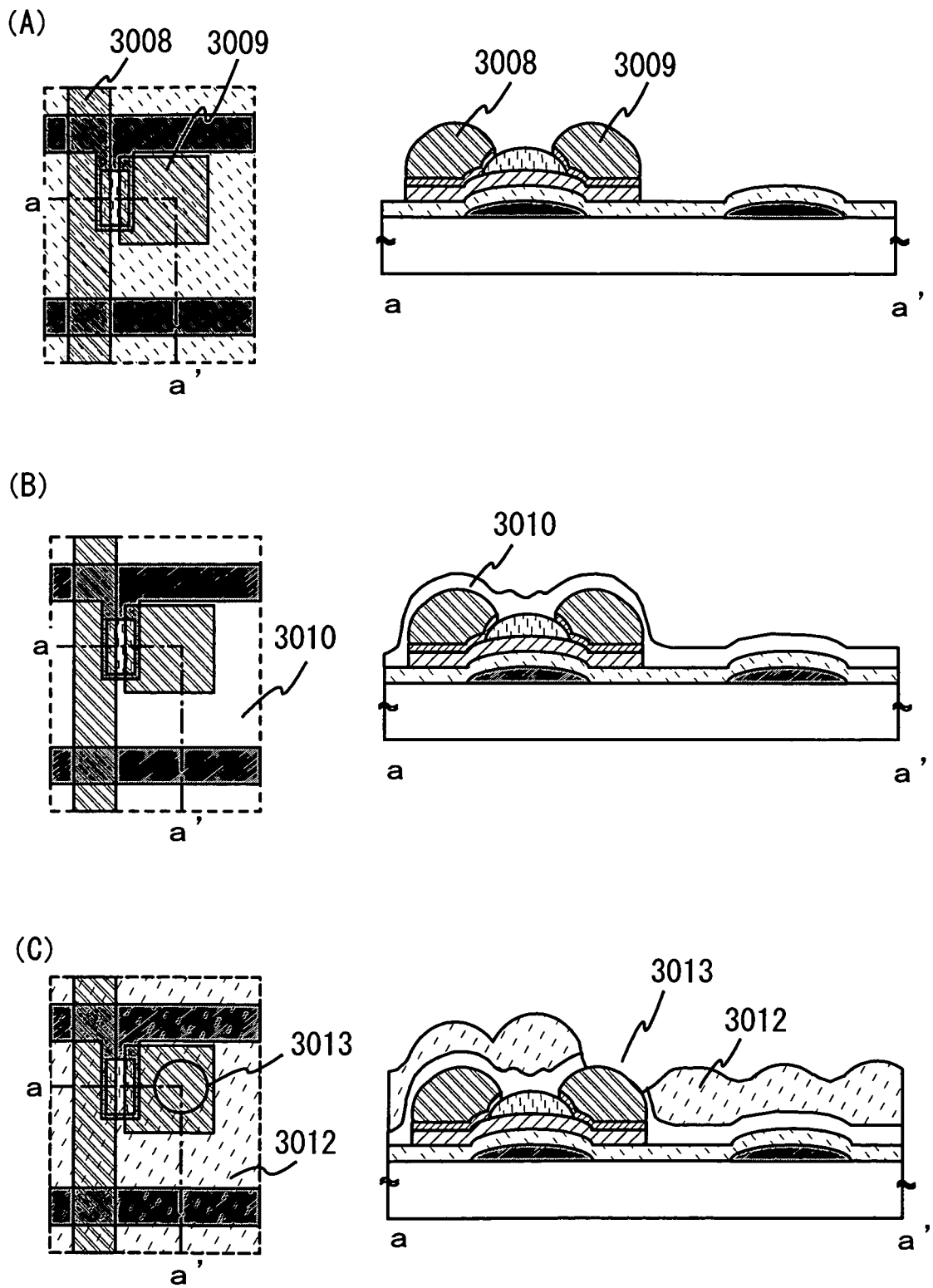
FIGS. 17(A) to (C) are pattern diagrams of manufacturing processes which relates to the embodiment 2 of the invention, and left diagrams are top views, and right diagrams are cross-section views of a-a' of the left diagrams, respectively.

After that, by use of the source/drain electrodes and wirings 3008, 3009 as a mask, the amorphous semiconductor film 3007, in which an impurity element for giving n-type electric conductivity is added, and the active semiconductor layer 3005 are etched by forming line form plasma through the use of the plasma processing apparatus which has plasma generating means under atmospheric pressure, and by scanning this (FIG. 17(A)). In a channel forming part, the active semiconductor layer 3005 under the channel protective film (etching stop film) 3006 is not etched, by the channel protective film (etching stop film) 3006.

Further, by use of a publicly known method such as a CVD method, a protective film 3010 is formed (FIG. 17(B)). In the embodiment, as the protective film 3010, a silicon nitride film is formed under atmospheric pressure by the CVD method, but it would be also fine if a silicon oxide film or a laminated layer configuration of these is formed. Also, it is possible to use an organic resin film such as an acrylic film.

After that, a resist is emitted by the line form droplet emitting apparatus, to form a resist pattern 3012, and thereafter, by use of the plasma processing apparatus which has the plasma generating means under atmospheric pressure, line form plasma is formed, and etching of the protective film 3010, which is not covered with the resist pattern 3012, is carried out. In this manner, a contact hole 3013 is formed (FIG. 17(C)). It is desirable that a diameter of the contact hole 3013 is formed with an range of 2.5 to 30 μm, by adjusting a gas flow and a high frequency voltage, etc. to be applied between electrodes.

Figure 18:
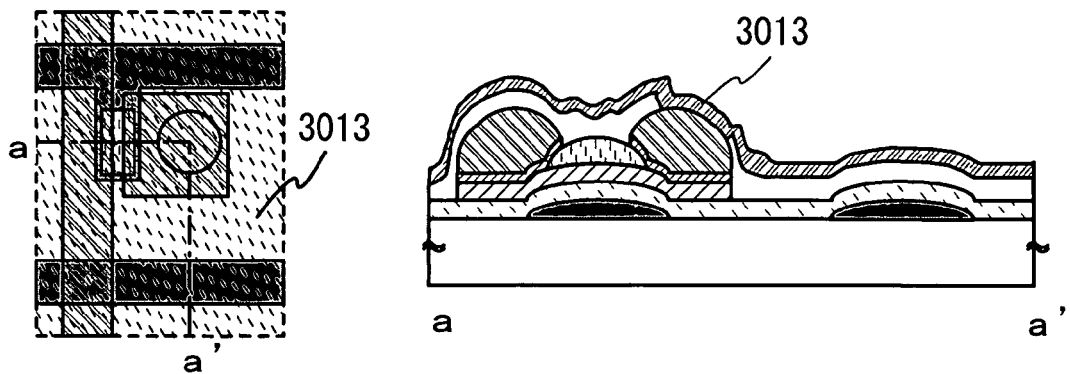
FIGS. 18(A) to (C) are pattern diagrams of manufacturing processes which relates to the embodiment 2 of the invention, and left diagrams are top views, and right diagrams are cross-section views of a-a' of the left diagrams, respectively.
Figure 18:
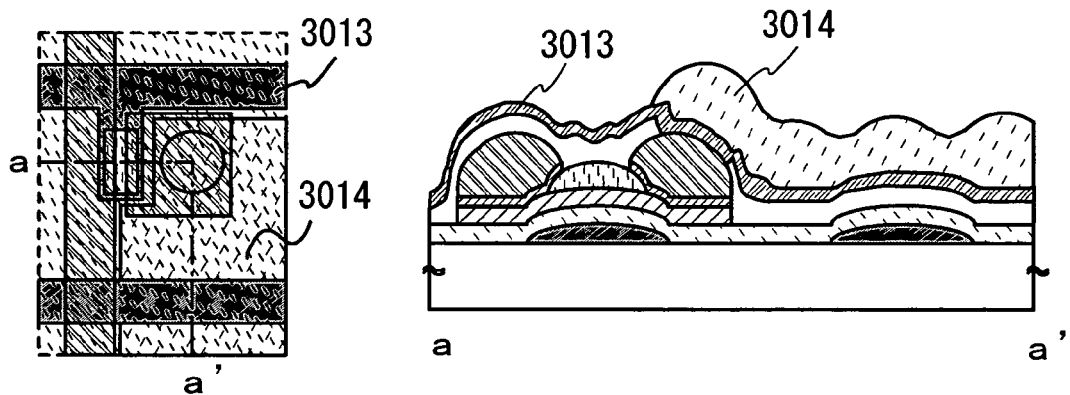
Figure 18:
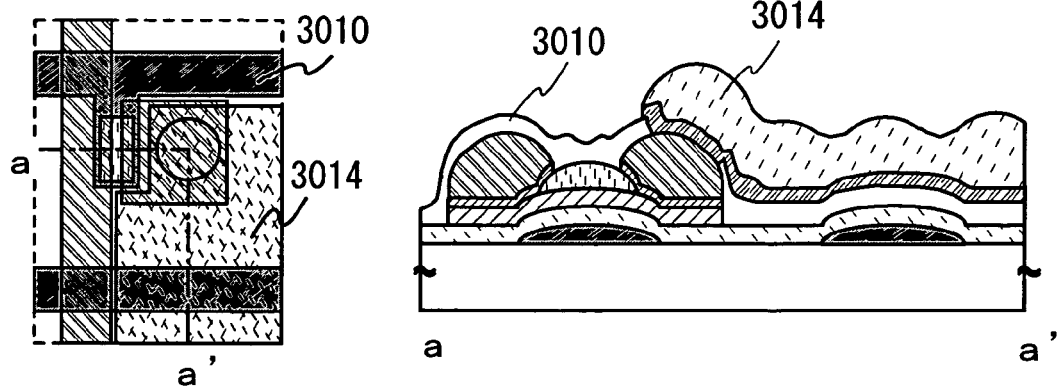
Figure 19:
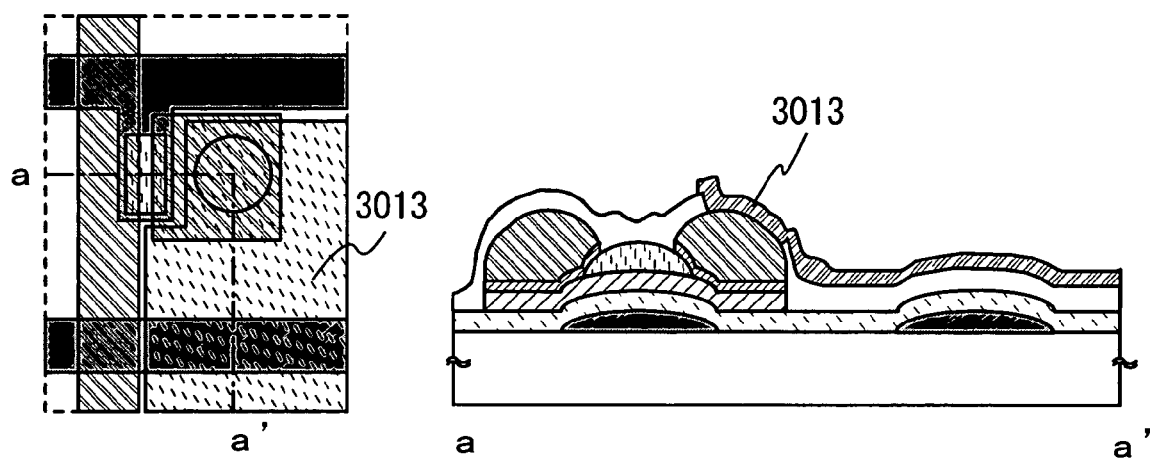
FIG. 19 is a pattern diagram of manufacturing processes which relates to the embodiment 2 of the invention, and left diagrams are top views, and right diagrams are cross-section views of a-a' of the left diagrams, respectively.

After that, by a publicly known method such as sputter, a material 3013, which becomes a pixel electrode, is film-formed on a whole surface of an object to be processed. As a material of the pixel electrode, it is possible to use a transparent electric conductive film such as ITO (indium oxide tin oxide alloy), indium oxide zinc oxide alloy ($In_2O_3$—ZnO), and zinc oxide (ZnO), or an electric conductive material such as molybdenum (Mo), titanium (Ti), tantalum (Ta), tungsten (W), chromium (Cr), aluminum (Al), copper (Cu), aluminum (Al) including neodymium (Nd) etc., and a laminated layer of these or alloy. Subsequently, a resist is emitted by the line form droplet emitting apparatus, and a pixel electrode forming area is covered with a resist pattern 3014 (FIG. 18(B)). Further, by use of the plasma processing apparatus which has plasma generating means under atmospheric pressure, line form plasma is formed, and a pixel electrode material, which is not covered by a resist pattern 3012, is etched and removed (FIG. 18(C)). And, by use of the plasma processing apparatus which has plasma generating means under atmospheric pressure, the resist pattern 3014 is removed by ashing, and thereby, a pixel electrode 3013 is formed (FIG. 19).

In the embodiment 2, the example of manufacturing the channel stop type thin film transistor was shown, without using a photo mask which is used in a conventional photolithography process, but it is needless to say that a channel etch type thin film transistor, which does not use a channel stop film, may be manufactured by the above-described apparatus.

In the embodiment 1 and the embodiment 2, the manufacturing method of the display device was shown, but it is also possible to manufacture a display device which uses a crystalline semiconductor typified by polysilicon by use of a similar manufacturing method.

Also, the above-described display apparatus, which used the amorphous semiconductor and the crystalline semiconductor, is a liquid crystal display device, but it would be also fine if a similar manufacturing method is applied to a light emitting display device (EL (Electro-Luminescence) display device).

Meanwhile, without limiting to the above-described configuration, by use of a plasma processing method which has a droplet emitting apparatus which has a droplet emitting head in which one or a plurality of droplet emitting holes are disposed, and a plasma generating mechanism under atmospheric pressure or the vicinity of atmospheric pressure, for carrying out local plasma processing, it is also possible to manufacture a display device of the invention in the same manner.

EMBODIMENT 3

Figure 26:
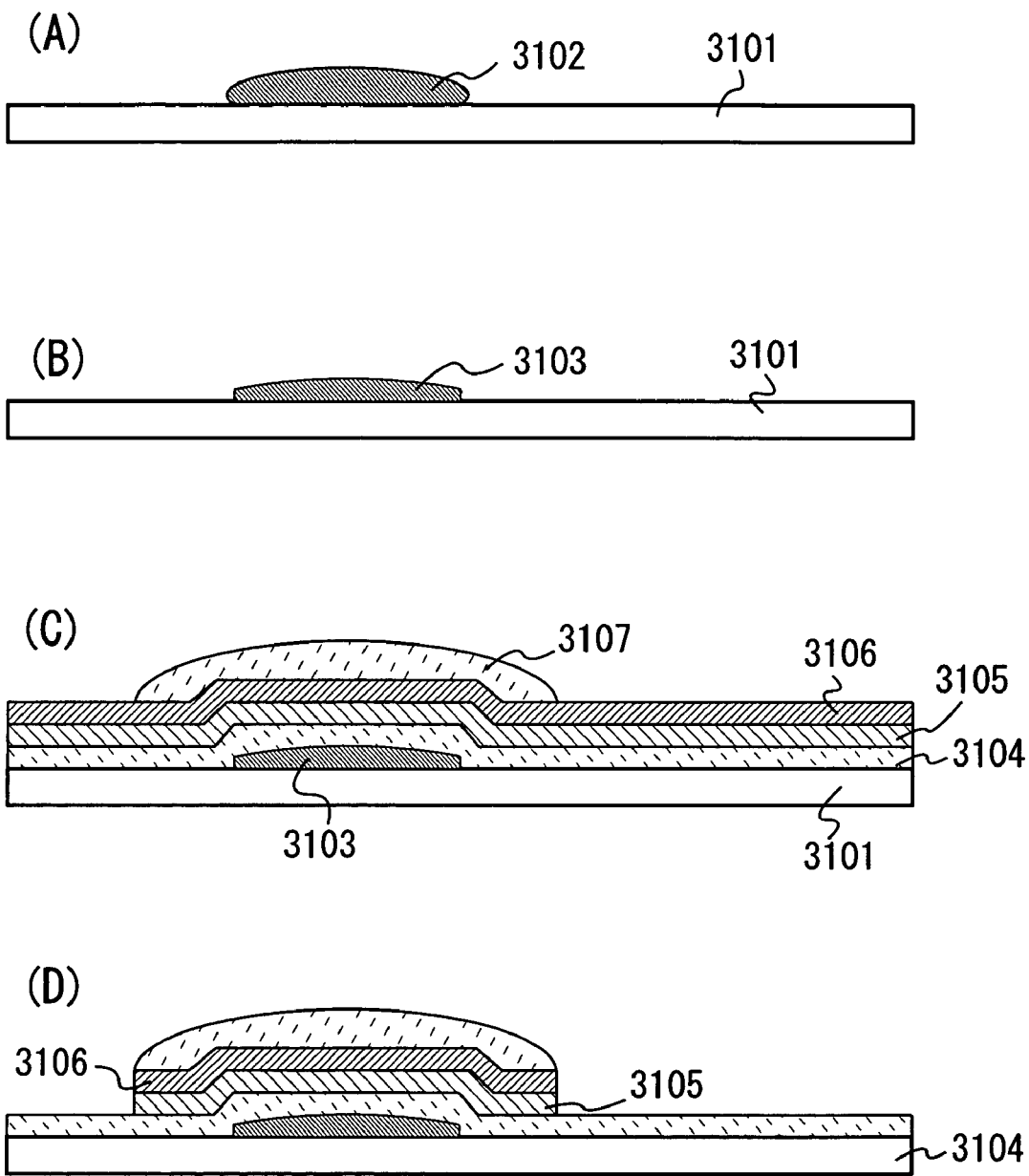
FIGS. 26(A) to 26(D) are pattern diagrams of a process for manufacturing a channel etch type TFT by use of the invention.
Figure 27:
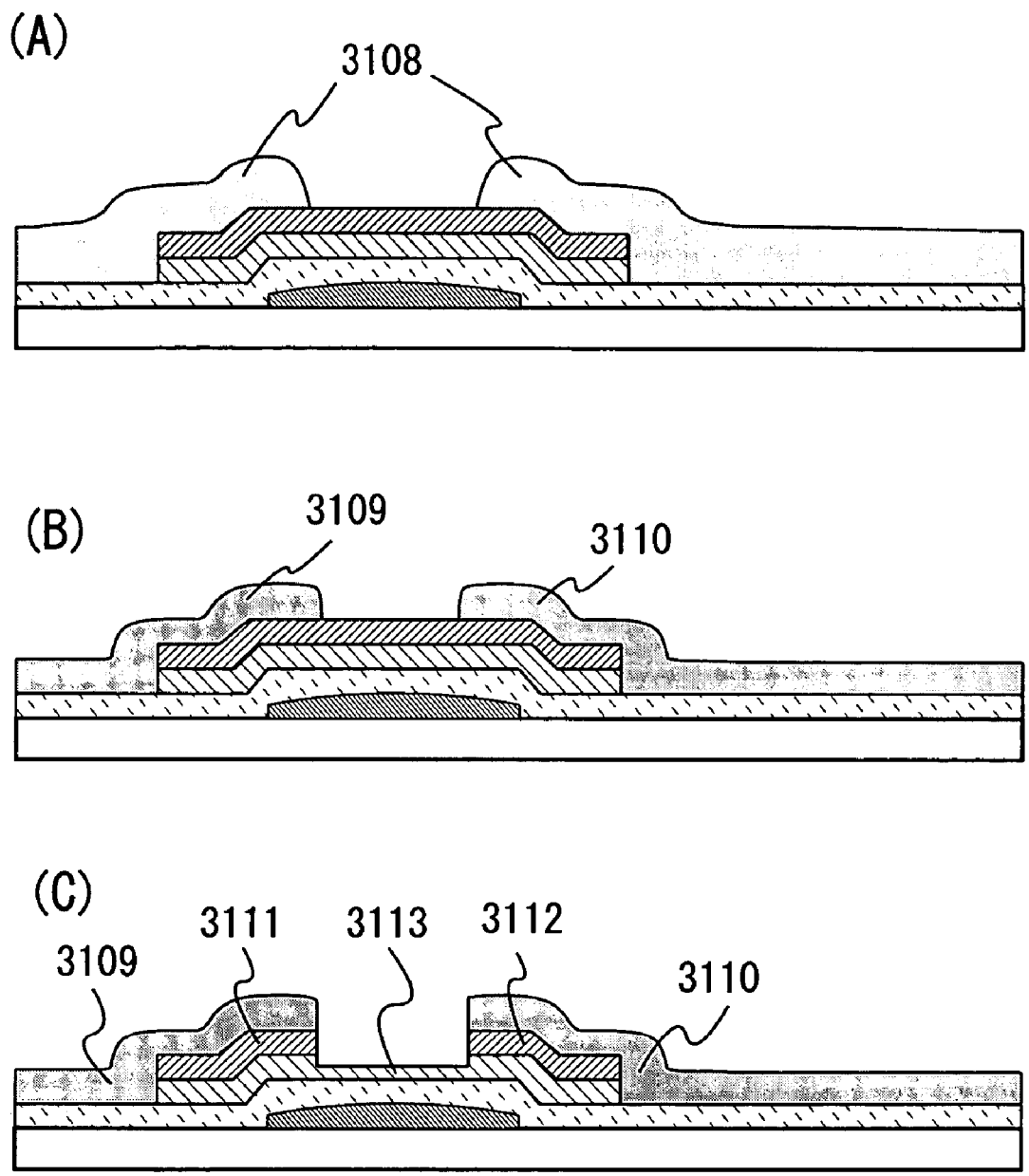
FIGS. 27(A) to 27(C) are pattern diagrams of a process for manufacturing the channel etch type TFT by use of the invention.

A manufacturing method of a display device of the invention, which uses a droplet emitting apparatus which has a droplet emitting head in which a droplet emitting hole is disposed in a line form, and a plasma processing apparatus which has plasma generating means under atmospheric pressure or the vicinity of atmospheric pressure, will be explained. Meanwhile, either a line form droplet emitting apparatus and a dot form droplet emitting apparatus may be used as the droplet emitting apparatus. Hereinafter, with reference to FIG. 26 to FIG. 27, an embodiment of the invention will be described. This embodiment is a manufacturing method of a channel etch type thin film transistor (TFT).

Firstly, on a substrate 3101, a thin film (not shown in the figure) including Ti is film-formed. Here, a Ti thin film with 5 nm or less was film-formed on a glass substrate, but it is not limited to this. By film-forming the thin film including Ti, it is possible to heighten adhesion between an electric conductive film which will be formed by pouring out a composition which includes an electric conductive material at later time, and the substrate. Also, since the Ti thin film is oxidized to become $TiO_2$ on the occasion of baking the electric conductive film, it is possible to improve a transmission factor. Also, although it is not shown in the figure, for the purpose of preventing diffusion of impurities etc. from the substrate side, an insulating film such as silicon oxide ($SiO_x$), silicon nitride ($SiN_x$), silicon oxide nitride ($SiO_xN_y$)(x>y), silicon nitride oxide ($SiN_xO_y$)(x>y)(x, y=1, 2. . . ) may be also formed.

Next, by pouring out a composition which includes an electric conductive film from a nozzle, to a portion where a gate electrode is formed, by use of a droplet pouring-out method, an electric conductive film 3102 is selectively formed (FIG. 26(A)). As an electric conductive material, Ag was used, but it is not limited to this. On this occasion, a shape of the electric conductive film becomes a rounded shape by surface tension of droplets.

Here, Ag was used as the electric conductive film, it is not limited to this. In addition to this, it is also possible to use such a thing that an electric conductive material of metal such as Au, Cu, Ni, Pt, Pd, Ir, Rh, W, Al, Ta, Mo, Cd, Zn, Fe, Ti, Si, Ge, Zr, and Ba, fine particles of silver halide etc., or dispersive nano-particles etc. is solved or dispersed insolvent. Here, as the solvent, tetradecan etc. may be used. Also, as droplet pouring-out conditions etc., it is possible to adopt a similar thing to the implementation modes.

Meanwhile, with regard to a metal material, having regard to a specific resistance value, it is preferable to use such a thing that any one material of gold, silver, copper is solved or dispersed in solvent. More preferably, it is fine to use silver or copper with low resistance. In this regard, however, in a case of using copper, it would be fine if a barrier film is additionally used as measures against impurities. As the solvent, it would be fine if an ester class such as butyl acetate and ethyl acetate, an alcohol class such as isopropyl alcohol and ethyl alcohol, an organic solvent such as methyl ethyl ketone and acetone, are used. Also, as the barrier film in a case of using copper as wiring, it would be fine if an insulative or electric conductive material, which includes nitrogen, such as silicon nitride, silicon nitride oxide, aluminum nitride, titaniumnitride, and tantalum nitride (TaN: TantalumNitride), is used.

Also, it is suitable that viscosity of a composition which is used for emission of droplet is 300 Pa·s or less. This is because drying is prevented, and a composition is enabled to be poured out smoothly from an emitting outlet. Further, it would be fine if viscosity, surface tension, etc. of a composition is properly adjusted, in tune with solvent which is used and a use application. As one example, viscosity of a composition in which ITO, ITSO, organic indium, organic tin are solved or dispersed in solvent is 5 to 50 mPa·s, and viscosity of a composition in which silver is solved or dispersed in solvent is 5 to 20 mPa·s, and viscosity of a composition in which gold is solved or dispersed in solvent is 10 to 20 mPa·s. Also, it is suitable that viscosity of a composition which is used for emission of droplets is 300 Pa·s or less. This is because drying is prevented, and a composition is enabled to be poured out smoothly from an emitting outlet. Further, it would be fine if viscosity, surface tension, etc. of a composition is properly adjusted, in tune with solvent which is used and a use application. As one example, viscosity of a composition in which ITO, ITSO, organic indium, organic tin are solved or dispersed in solvent is 5 to 50 mPa·s, and viscosity of a composition in which silver was solved or dispersed in solvent is 5 to 20 mPa·s, and viscosity of a composition in which gold is solved or dispersed in solvent is 10 to 20 mPa·s.

Next, the electric conductive film 3102 is baked under atmosphere which includes at least nitrogen and oxygen. Here, gas, in which oxygen is mixed with nitrogen, is used, and partial pressure of oxygen which is taken over in mixed gas is set to 25%, and baking conditions are set to 230° C., 1 hour, but it is not limited to this. In this manner, by carrying out baking under atmosphere which includes $O_2$, after the electric conductive film 3102 is formed by the droplet pouring-out method, smoothness of the electric conductive film is improved, and further, realization of a thin film and low resistance is facilitated.

Passing through the above-described baking process, a gate electrode 3103 is formed (FIG. 26(B)). Meanwhile, in a case that it is intended to further improve the smoothness, it is also possible to carry out planarization processing. For example, it is possible to use a CMP (Chemical Mechanical Polishing) method, etch back, re-flow, a coating method, embedding of oxide, bias sputter, selective growth due to CVD, laser, etc.

Next, on the gate electrode 3103, a gate insulating film 3104 is formed (FIG. 26(C)). Here, a silicon oxide nitride (SiON) with a film thickness of 110 nm is formed by a plasma CVD method, but it is not limited to this. For example, it would be also fine if silicon nitride ($SiN_x$) with a film thickness of 100 to 400 nm is formed by a thin film forming method such as a sputtering method. Also, it would fine if it is formed with silicon oxide or the other insulating film including silicon.

Next, on the gate insulating film 3104, a semiconductor film 3105 is formed (FIG. 26(C)). Here, a semi-amorphous silicon (SAS) film with a film thickness of 10 to 300 nm is formed by a plasma CVD method, but it is not limited to this.

Here, a semi-amorphous semiconductor will be explained. The semi-amorphous semiconductor means a semiconductor which has an intermediate structure between amorphous and crystalline structures (including single crystalline, poly crystalline), and has a stable third status from the standpoint of free energy, and a semiconductor which has short-distance order and includes a crystalline area having lattice distortion. In at least a partial area in the film, it includes crystal grains of 0.5 to 20 nm, and is called as so-called micro-crystal semiconductor (micro-crystal semiconductor). Also, it has such a characteristic that a raman spectrum is shifted to the side of lower wave number than 520 $cm^{-1}$, and diffraction peaks of (111),(220), which is said to be derived from Si crystal lattice in X-ray diffraction, are observed. Also, as a neutralizing agent of unbonding hand (dangling bond), it includes at least 1 atomic % or more of hydrogen or halogen.

Semi-amorphous silicon is formed by grow-discharge-resolving silicide gas such as $SiH_4$, $Si_2H_6$, $SiH_2Cl_2$, $SiHCl_3$, $SiCl_4$, and $SiF_4$, by a plasma CVD method. This silicide gas may be diluted with $H_2$, or $H_2$ and He, one or a plurality kinds of rare gas elements selected from Ar, Kr, Ne. It is fine to set up a dilution rate in the range of 2 to 1000 times, and pressure in the range of roughly 0.1 Pa to 133 Pa, and power supply frequency in the range of 1 MHz to 120 MHz, preferably 13 MHz to 60 MHz. Also, substrate heating temperature is set to 350° C. or less, preferably 100 to 300° C. It is desirable that, among impurity elements in the film, impurities of atmospheric constituents such as oxygen, nitrogen and carbon is set to $1\times10^{20}$ $cm^{-3}$ or less, and in particular, oxygen concentration is set to $5\times10^{19}$ $cm^{-3}$ or less, preferably $1\times10^{19}$ $cm^{-3}$ or less. Meanwhile, the forming method of SAS, which was explained here, is also applicable to the implementation modes 1, 2.

Next, on the semiconductor film 3105, n-type semiconductor film 3106 is formed (FIG. 26(C)). Here, by glow-discharge-resolving mixed gas of $SiH_4$, $H_2$, $PH_3$(phosphine) by use of a plasma CVD method, n-type (n+) semi-amorphous silicon film with a film thickness of 40 to 60 nm was formed, but it is not limited to this.

The gate insulating film 3104, the semiconductor film 3105 and the n-type semiconductor film 3106 can be film-formed continuously, in an identical chamber of a plasma CVD apparatus etc. Meanwhile, in order to realize characteristic stabilization and performance improvement of TFT, it is desirable that forming temperature of the gate insulating film 3104 is set to an extent of 300° C. or more, and film forming temperature of the amorphous silicon film is set to an extent of 300° C. or less where hydrogen, which comes to be mixed in the film, is not desorbed.

Meanwhile, as the semiconductor film 3105 and the n-type semiconductor film 3106, an amorphous semiconductor film, and a crystalline semiconductor film may be also used.

Next, on the n-type semiconductor film 3106, a mask pattern 3107 is formed (FIG. 26(C)). It would be fine if the mask pattern 3107 is formed by use of a photo resist as is conventionally done, but it is preferable to use the droplet pouring-out method. In this case, it is preferable to form by use of a heat-resisting polymeric material, and it is preferable to use a polymer material which has aromatic rings, heterocyclic rings as a principal chain, and has few aliphatic portions, and includes high polar hetero atom groups. As representative examples of such high polymer, polyimide or polybenzoimidazole etc. are cited. In a case of using polyimide, it would be fine if a composition, which includes polyimide, is poured out from a nozzle on the n-type semiconductor film, and baked at 200° C., for 30 minutes, to form.

Next, the semiconductor film 3105 and the n-type semiconductor film 3106 are etched by use of the mask pattern 3107 as a mask (FIG. 26(D)). By this, the semiconductor film 3105 and the n-type semiconductor film 3106 are formed in an island shape. After they are etched, the mask pattern is removed by $O_2$ ashing etc.

Meanwhile, it is also possible to carry out this etching by utilizing atmospheric pressure plasma. On this occasion, it is fine to use mixed gas of $CF_4$ and $O_2$ as etching gas. Also, it is also possible to carry out etching with mask-less, by blowing etching gas locally to carry out etching.

Next, in the island shaped n-type semiconductor film, electric conductive films 3108, which become a source electrode and a drain electrode, are formed above portions which become a source region and a drain region, by the droplet pouring-out method (FIG. 27(A)). As an electric conductive material, it is possible to use such a thing that the same material as the material which is used for the gate electrode, is solved or dispersed in solvent. As one example, a composition, which includes Ag, is poured out selectively, to form an electric conductive film. On this occasion, a shape of the electric conductive film becomes a rounded shape by surface tension of droplets.

Next, the electric conductive film is baked under atmosphere which includes at least nitrogen and oxygen, to form a source electrode 3109, a drain electrode 3110 (FIG. 27(B)). Here, gas, in which oxygen is mixed with nitrogen, is used, and partial pressure of oxygen which is taken over in mixed gas is set to 25%, and baking conditions are set to 230° C., 1 hour, but it is not limited to this. In this manner, by carrying out baking under atmosphere which includes $O_2$, after the electric conductive film is formed by the droplet pouring-out method, smoothness of the electric conductive film is improved, and further, realization of a thin film and low resistance is facilitated.

Next, by use of the source electrode 3109, the drain electrode 3110 as masks, upper parts of the n-type semiconductor film and the island shaped semiconductor film are removed by etching, and thereby, a source region 3111, a drain region 3112, a channel region 3113 are formed (FIG. 27(C)). On this occasion, there is a necessity to carry out etching with a high selectivity with the gate insulating film, in order to suppress damages of a semiconductor film which becomes a channel region of TFT.

Meanwhile, it is also possible to carry out this etching by utilizing atmospheric pressure plasma. On this occasion, it is fine to use mixed gas of $CF_4$ and $O_2$ as etching gas. Also, it is also possible to carry out etching with mask-less, by blowing etching gas locally to carry out etching.

By the above-described processes, a channel etch type TFT is completed. Meanwhile, it would be also fine if a passivation film is film-formed on the source electrode 3109, the drain electrode 3110. It is possible to form the passivation film, by use of a thin film forming method such as a plasma CVD method or a sputtering method, and by use of an insulating material such as silicon nitride, silicon oxide, silicon nitride oxide, silicon oxide nitride, aluminum oxide nitride, or aluminum oxide, DLC, and nitrogenous carbon. Further, it would be also fine if it is formed by laminating these materials.

Also, although it is not shown in the figure, it is possible to manufacture a wiring which is connected to the gate electrode, and other wirings which are connected to the source electrode, the drain electrode, by utilizing the droplet pouring-out method. That is, it would be fine if a mask pattern is formed by the droplet pouring-out method and an etching process is carried out, and it would be also fine if an electric conductive composition is directly drawn to form wiring. At the time when wiring is formed by the droplet pouring-out method, an amount of expectation may be adjusted by exchanging a pour-out outlet, depending on a width of the wiring. For example, in a gate signal line and a gate electrode, it is possible to form the gate signal line with a thick pattern, and to form the gate electrode with a narrow pattern, in desired shapes, respectively. Also, by forming the mask pattern by the droplet pouring-out method, it is possible to omit processes of, coating of resist, baking of resist, exposure, development, baking after development, etc. As a result of that, it is possible to realize substantial reduction of costs due to simplification of processes. In this manner, by using the droplet pouring-out method on the occasion of forming electrode, wiring, mask pattern, etc., it is possible to form a pattern at an arbitrary place, and to adjust a thickness and a size of a pattern to be formed, and therefore, it is possible to manufacture even on such a large area substrate that one side exceeds 1 meter, at low cost and with high yield.

EMBODIMENT 4

Figure 20:
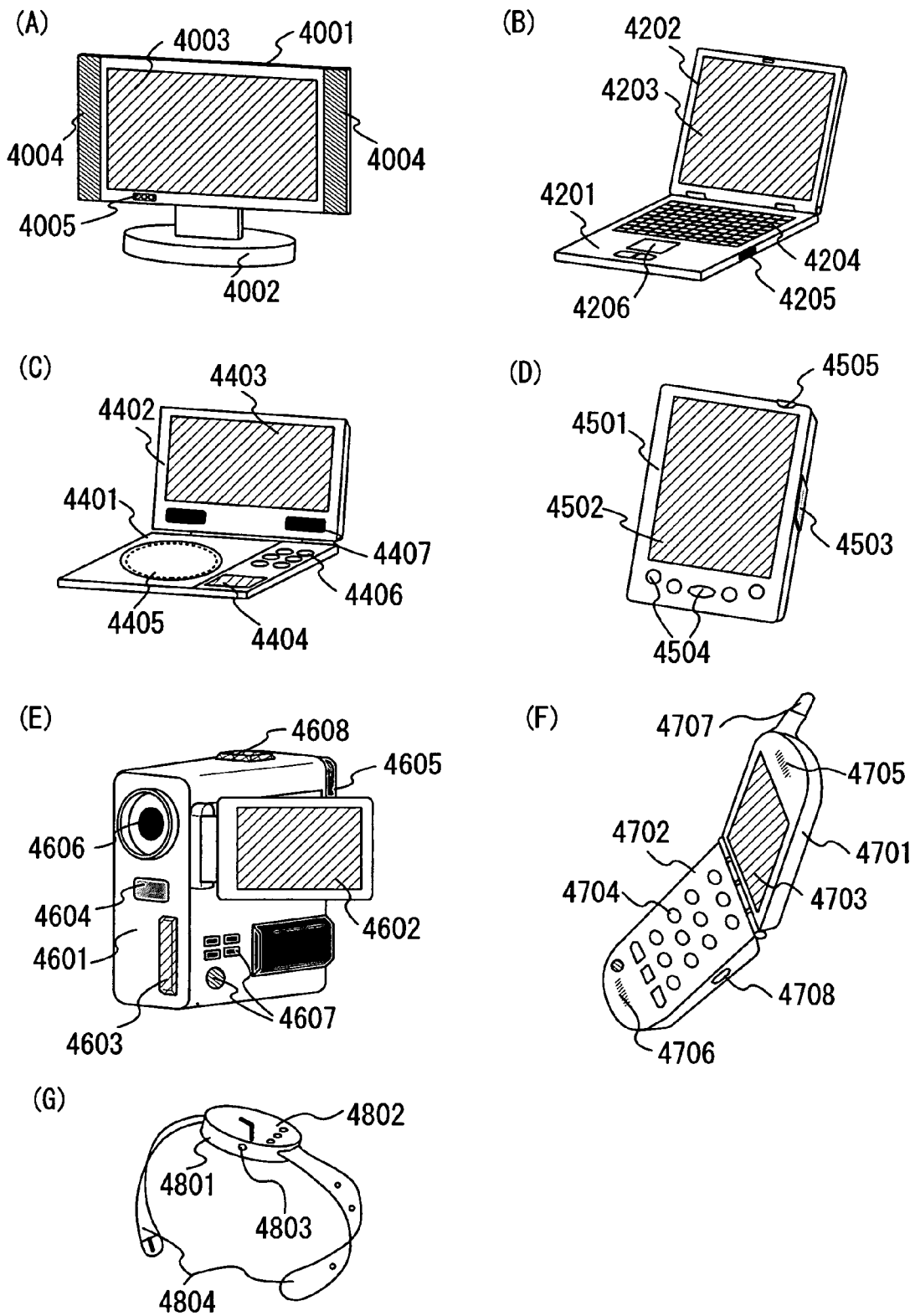
FIGS. 20(A) to 20(G) are views which shows an electronic device which relates to an embodiment 4 of the invention.

By use of the invention, it is possible to complete various electric appliances. By utilizing the invention, it is possible to realize simplification of processes, small size of an apparatus and by extension, of a manufacturing facility, and also speed-up of processes, and therefore, it becomes possible to manufacture products in a simplified manner and at a short time. Its concrete example will be explained by use of FIG. 20.

FIG. 20(A) is of a display device apparatus which has a large size display part of for example, 20 to 80 inches, and includes a housing 4001, a support table 4002, a display part 4003, a speaker part 4004, a video input terminal 4005, etc. The invention is applied to a manufacture of the display part 4003. It is suitable to manufacture such large size display apparatus by use of a large size substrate of such meter square as so-called fifth generation (1000×1200 $mm^2$), sixth generation (1400×1600 $mm^2$), and seventh generation (1500×1800 $mm^2$).

FIG. 20(B) is of a notebook type personal computer, and includes a main body 4201, a housing 4202, a display part 4203, a keyboard 4204, an external connection port 4205, a pointing mouse 4206, etc. The invention is applied to a manufacture of the display part 4203.

FIG. 20(C) is of a portable type image reproducing apparatus (concretely speaking, DVD reproducing apparatus) which is equipped with a recording medium, and includes a main body 4401, a housing 4402, a display part A 4403, a display part B 4404, a recording medium (DVD etc.) reading part 4405, an operation key 4406, a speaker part 4407, etc. The display part A 4403 displays mainly image information, and the display B 4404 displays mainly textual information, and the invention is applied to a manufacture of these display part A, B 4403, 4404.

FIG. 20(D) is of a portable type terminal, and includes a main body 4501, a display part 4502, an external connection port 4503, an operation switch 4504, a power supply switch 4505, etc. The invention is applied to a manufacture of the display part 4502. Meanwhile, in this portable type terminal, PDA (Personal Digital(Data) Assistance), a portable type game machine, an electronic book, an electronic notebook, etc. are included.

FIG. 20(E) is of a video camera, and includes a main body 4601, a display part 4602, an external connection port 4603, a remote controller reception part 4604, an eye piece 4605, an image reception part 4606, an operation key 4607, a microphone 4608, etc. The invention can be applied to a manufacture of the display part 4602.

FIG. 20(F) is of a portable telephone, and includes a housing 4701, a main body 4702, a display part 4703, an operation switch 4704, a sound output part 4705, a sound input part 4706, an antenna 4707, an external connection port 4708, etc. The invention can be applied to a manufacture of the display part 4703.

FIG. 20(G) is of a watch type display apparatus, and includes a main body 4801, a display part 4802, an operation switch 4803, a belt 4804, etc. The invention can be applied to a manufacture of the display part 4802.

As above, an applicable scope of the invention is extremely wide, and it is possible to apply the invention to a manufacture of an electric appliance in a every field. Also, it is possible to freely combine the above-described implementation modes and embodiments.

EMBODIMENT 5

In this embodiment, in order to form a wiring pattern, used is a composition in which metal fine particles are dispersed in organic solvent. The metal fine particles having an average particle size of 1 to 50 nm and preferably 3 to 7 nm are used. Representatively, they are silver or gold fine particles, and such things that its surface is coated with a dispersing agent such as amine, alcohol, and thiol. The organic solvent is phenol resin, epoxy resin, etc., and a heat-curable or light-curable thing is applied. As for viscosity adjustment of this composition, it would be fine if a thixo agent or dilution solvent is added.

A composition, which is poured out in proper quantity on a surface to be formed by droplet pouring-out means, hardens the organic solvent by heat treatment or light irradiation processing. Metal particles contact with each other due to contraction in volume which comes up with hardening of the organic solvent, and amalgamation, fusion-bonding, or aggregation is accelerated. That is, formed is such wiring that metal fine particles with an average particle diameter of 1 to 50 nm, preferably 3 to 7 nm are amalgamated, fusion-bonded, or aggregated. In this manner, by forming such a status that metal particles are in surface contact with each other due to amalgamation, fusion-bonding, or aggregation, it is possible to realize low resistance of wiring.

The invention forms a wiring pattern by use of such composition, and thereby, it also becomes easy to form a wiring pattern with a line width of a range of 1 to 10 μm. Also, even if a diameter of a contact hole is in a range of 1 to 10 μm, it is possible to fill a composition therein. That is, it is possible to form a multilevel wiring configuration by use of a fine wiring pattern.

Meanwhile, if fine particles of an insulating material are used in lieu of the metal fine particles, it is possible to form an insulating pattern in the same manner.

Meanwhile, it is possible to freely combine this embodiment with the above-described implementation modes and embodiments.

INDUSTRIAL APPLICABILITY

A display device is manufactured by use of a droplet emitting apparatus which has a droplet emitting head in which circular droplet emitting holes are disposed in a line form, and a plasma processing apparatus which has plasma generating means under atmospheric pressure, and thereby, it becomes possible to reduce waste of a material (material of wiring etc. in droplet emitting means, and gas in plasma processing means). At the same time, it becomes possible to reduce production cost. Further, by using the apparatus, it becomes possible to realize simplification of processes, small size of an apparatus and a manufacturing factory, a manufacturing facility, and also, speed-up of processes. Also, it is possible to reduce energy, such that it is possible to simplify an equipment of an air discharging system which is required in the prior art, and therefore, it is possible to reduce environmental burdens.

Also, the invention is a manufacturing process which responds to a large size substrate, and is a thing which solve various problems such as growing in size of an apparatus which comes up with growing in size of a conventional apparatus, and increase of processing time.

The invention claimed is:

1. A manufacturing method of a display device comprising:
    forming a transistor over a substrate having a size of 1000× 1200 mm$^2$ or larger, the transistor comprising a gate electrode, a gate insulating film, and a semiconductor layer that has a source region, a drain region, and a channel region; and
    forming a pixel electrode that is electrically connected to one of the source region and the drain region,
    wherein the gate electrode is formed by:
        selectively forming a pattern including a metal material by use of droplet emitting means;
        selectively forming a resist by use of droplet emitting means, over the pattern;
        etching the pattern by use of atmospheric plasma; and
        ashing the resist by use of atmospheric plasma processing means after etching the pattern,
    wherein the droplet emitting means comprises a droplet emitting head in which a plurality of droplet emitting holes are disposed in a line form, and
    wherein the atmospheric plasma processing means comprises plasma generating means under 5 Torr to 800 Torr.

2. A manufacturing method of a display device according to claim 1, wherein the droplet for the resist comprises a photosensitive resist, and the droplet for the pattern comprises any one of a paste form metal material or organic liquid solution which includes the paste form metal, a ultra-fine particle form metal material or organic liquid solution which includes the metal material.

3. A manufacturing method of a display device comprising:
    forming a transistor over a substrate having a size of 1000× 1200 mm$^2$ or larger, the transistor comprising a gate electrode, a gate insulating film, a source electrode, a drain electrode, and a semiconductor layer that has a source region, a drain region, and a channel region; and forming a pixel electrode that is electrically connected to one of the source region and the drain region, wherein the source electrode and the drain electrode are formed by:
  selectively forming a pattern including a metal material by use of droplet emitting means;
  selectively forming a resist by use of droplet emitting means;
  etching the pattern by use of atmospheric plasma processing means; and
  ashing the resist by use of atmospheric plasma processing means, wherein the droplet emitting means comprises a droplet emitting head in which a plurality of droplet emitting holes are disposed in a line form, and wherein the atmospheric plasma processing means comprises plasma generating means under 5 Torr to 800 Torr.

4. A manufacturing method of a display device according to claim 3, wherein the droplet for the resist comprises a photosensitive resist, and the droplet for the pattern comprises any one of a paste form metal material or organic liquid solution which includes the paste form metal, a ultra-fine particle form metal material or organic liquid solution which includes the metal material.

5. A manufacturing method of a display device comprising:
  forming a transistor over a substrate having a size of 1000× 1200 mm$^2$ or larger, the transistor comprising a gate electrode, a gate insulating film, and a semiconductor layer that has a source region, a drain region, and a channel region; and
  forming a pixel electrode that is electrically connected to one of the source region and the drain region,
  wherein the gate electrode is formed by:
    selectively forming a pattern including a metal material by use of droplet emitting means;
    selectively forming a resist by use of droplet emitting means, over the pattern;
    etching the pattern by use of atmospheric plasma for carrying out local plasma processing; and
    ashing the resist by use of plasma processing means for carrying out local plasma processing, after etching the pattern,
  wherein the droplet emitting means comprises a droplet emitting head in which a plurality of droplet emitting holes are disposed, and
  wherein the plasma processing means for carrying out local plasma processing comprises plasma generating means under 5 Torr to 800 Torr.

6. A manufacturing method of a display device according to claim 5, wherein the droplet for the resist comprises a photosensitive resist, and the droplet for the pattern comprises any one of a paste form metal material or organic liquid solution which includes the paste form metal, a ultra-fine particle form metal material or organic liquid solution which includes the metal material.

7. A manufacturing method of a display device comprising:
  forming a transistor over a substrate having a size of 1000× 1200 mm$^2$ or larger, the transistor comprising a gate electrode, a gate insulating film, a source electrode, a drain electrode, and a semiconductor layer that has a source region, a drain region, and a channel region; and
  forming a pixel electrode that is electrically connected to one of the source region and the drain region,
  wherein the source electrode and the drain electrode are formed by:
    selectively forming a pattern including a metal material by use of a droplet emitting means;
    selectively forming a resist by use of a droplet emitting means, over the pattern;
    etching the pattern by use of plasma processing means for carrying out local plasma processing; and
    ashing the resist by use of plasma processing means for carrying out local plasma processing, after etching the pattern,
  wherein the droplet emitting means comprises a droplet emitting head in which a plurality of droplet emitting holes are disposed, and
  wherein the plasma processing means for carrying out local plasma processing comprises plasma generating means under 5 Torr to 800 Torr.

8. A manufacturing method of a display device according to claim 7, wherein the droplet for the resist comprises a photosensitive resist, and the droplet for the pattern comprises any one of a paste form metal material or organic liquid solution which includes the paste form metal, a ultra-fine particle form metal material or organic liquid solution which includes the metal material.

9. A manufacturing method of a display device comprising:
  forming a transistor over a substrate having a size of 1000× 1200 mm$^2$ or larger, the transistor comprising a gate electrode, a gate insulating film, a source electrode, a drain electrode, and a semiconductor layer that has a source region, a drain region, and a channel region; and
  forming a pixel electrode that is electrically connected to one of the source region and the drain region,
  wherein the gate electrode is formed by:
    selectively forming a first pattern including a metal material by use of droplet emitting means;
    selectively forming a first resist by use of droplet emitting means, over the first pattern;
    etching the first pattern by use of atmospheric plasma; and
    ashing the first resist by use of atmospheric plasma processing means after etching the first pattern,
  wherein the source electrode and the drain electrode are formed by:
    selectively forming a second pattern including a metal material by use of droplet emitting means;
    selectively forming a second resist by use of droplet emitting means;
    etching the second pattern by use of atmospheric plasma processing means; and
    ashing the second resist by use of atmospheric plasma processing means,
  wherein the droplet emitting means comprises a droplet emitting head in which a plurality of droplet emitting holes are disposed in a line form, and
  wherein the plasma processing means comprises plasma generating means under 5 Torr to 800 Torr.

10. A manufacturing method of a display device according to claim 9, wherein the droplet for at least one of the first resist and the second resist comprises a photosensitive resist, and the droplet for at least one of the first pattern and the second pattern comprises any one of a paste form metal material or organic liquid solution which includes the paste form metal, a ultra-fine particle form metal material or organic liquid solution which includes the metal material.

11. A manufacturing method of a display device comprising:
  forming a transistor over a substrate having a size of 1000× 1200 mm$^2$ or larger, the transistor comprising a gate electrode, a gate insulating film, a source electrode, a drain electrode, and a semiconductor layer that has a source region, a drain region, and a channel region; and forming a pixel electrode that is electrically connected to one of the source region and the drain region, wherein the gate electrode is formed by:

selectively forming a first pattern including a metal material by use of droplet emitting means;

selectively forming a first resist by use of droplet emitting means, over the first pattern;

etching the first pattern by use of atmospheric plasma for carrying out local plasma processing; and ashing the first resist by use of plasma processing means for carrying out local plasma processing, after etching the first pattern, wherein the source electrode and the drain electrode are formed by:

selectively forming a second pattern including a metal material by use of a droplet emitting means;

selectively forming a second resist by use of a droplet emitting means, over the second pattern;

etching the second pattern by use of plasma processing means for carrying out local plasma processing; and ashing the second resist by use of plasma processing means for carrying out local plasma processing, after etching the second pattern, wherein the droplet emitting means comprises a droplet emitting head in which a plurality of droplet emitting holes are disposed in a line form, and wherein the plasma processing means comprises plasma generating means under 5 Torr to 800 Torr.

12. A manufacturing method of a display device according to claim 11, wherein the droplet for at least one of the first resist and the second resist comprises a photosensitive resist, and the droplet for at least one of the first pattern and the second pattern comprises any one of a paste form metal material or organic liquid solution which includes the paste form metal, a ultra-fine particle form metal material or organic liquid solution which includes the metal material.

* * * * *